(12) United States Patent
Amemiya

(10) Patent No.: US 7,014,707 B2
(45) Date of Patent: Mar. 21, 2006

(54) APPARATUS AND PROCESS FOR PRODUCING CRYSTAL ARTICLE, AND THERMOCOUPLE USED THEREIN

(75) Inventor: Mitsuaki Amemiya, Omiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/487,718

(22) Filed: Jan. 19, 2000

(65) Prior Publication Data

US 2003/0131789 A1  Jul. 17, 2003

(30) Foreign Application Priority Data

Jan. 20, 1999  (JP) ............................................. 11-012506
Jan. 20, 1999  (JP) ............................................. 11-012507

(51) Int. Cl.
*C30B 11/00* (2006.01)

(52) U.S. Cl. .............................. 117/81; 117/82; 117/83; 117/940

(58) Field of Classification Search .................... 117/81, 117/82, 83, 940
See application file for complete search history.

(56) References Cited

U.S. PATENT DOCUMENTS

| | | | |
|---|---|---|---|
| 2,214,976 A | | 9/1940 | Stockbarger ................. 23/273 |
| 3,554,816 A | | 1/1971 | Moen .......................... 136/233 |
| 4,118,986 A | | 10/1978 | Werner et al. ................. 73/351 |
| 4,878,375 A | | 11/1989 | Roggen ........................... 73/19 |
| 4,945,774 A | | 8/1990 | Beard et al. ............. 73/863.11 |
| 5,037,621 A | * | 8/1991 | Kennedy et al. ............... 117/83 |
| 5,162,072 A | | 11/1992 | Azad |
| 5,169,486 A | * | 12/1992 | Young et al. .................. 117/83 |
| 5,197,531 A | | 3/1993 | Hugo et al. .............. 164/122.1 |
| 5,656,079 A | * | 8/1997 | Bliss et al. .................... 117/81 |
| 6,123,764 A | * | 9/2000 | Mizugaki et al. ............. 117/81 |
| 6,136,091 A | * | 10/2000 | Yamazaki et al. ............. 117/83 |
| 6,139,627 A | * | 10/2000 | Duval et al. ................... 117/81 |

FOREIGN PATENT DOCUMENTS

| | | |
|---|---|---|
| EP | 0338411 A2 | 10/1989 |
| EP | 0338411 | 10/1989 |
| EP | 0463229 A1 | 1/1992 |
| EP | 0463229 | 1/1992 |
| EP | 0889148 A1 | 1/1999 |
| EP | 0 995 850 A1 | 4/2000 |

OTHER PUBLICATIONS

R. Caram et al.; Journal of Crystal Growth; "Directional Solidification of PB–SN Eutectic with Vibration"; vol. 114, No. 1/02; Oct. 1, 1991; pp. 248–254.
Y. Wang et al.; Journal of Crystal Growth; "Crystal Growth of $Cr^{3+}$:LICaAlF$_6$ by Bridgman Technique"; vol. 167, No. 1; Sep. 1, 1996; pp. 176–179.
European Search Report for Application No. 03023443.9–2219.
Article published in *Journal of Crystal Growth* in October 1991, by Caram et al., entitled Directional Solidification of Pb–Sn Eutectic With Vibration, pp. 249–254.
Article published in *Journal of Crystal Growth* in 1991, by Wang, et al., entitled Crystal growth of $Cr^1+$: LicaAlF$_6$ by Bridgman technique, pp. 176–179.

* cited by examiner

*Primary Examiner*—Robert Kunemund
(74) *Attorney, Agent, or Firm*—Fitzpatrick, Cella, Harper & Scinto

(57) ABSTRACT

In order to prevent a region of supercooling from increasing and to effect uniform crystal growth, the generation of latent heat is detected from changes in temperature of a crucible or a heater or from changes in heat flow rate and also the position of solid-liquid interface is mathematically found, to control the crucible-descending rate or temperature distribution so that the crystal growth rate can be kept at a predetermined value.

15 Claims, 22 Drawing Sheets

US 7,014,707 B2

APPARATUS AND PROCESS FOR PRODUCING CRYSTAL ARTICLE, AND THERMOCOUPLE USED THEREIN

BACKGROUND OF THE INVENTION

1. Field of the Invention

This invention relates to an apparatus for producing a crystal article (a crystal growth apparatus) and a process for producing a crystal article (a crystal growth process). More particularly, it relates to an apparatus, and a process, for producing a crystal article usable as a large-diameter single-crystal optical component part having a refractive index in a good uniformity. This invention also relates to a thermocouple, a temperature measuring system and a feedthrough which are used in the above apparatus.

2. Related Background Art

The background art will be described taking the case of a calcium fluoride crystal as a single-crystal article.

In recent years, as semiconductor exposure devices are required to have a high resolution, it is being sought to use excimer lasers that emit light having shorter wavelengths than those of Kr—F rays (248 nm) or Ar—F rays (193 nm). With this trend, fluorite attracts notice, which is a $CaF_2$ crystal having a high transmittance and low dispersion to light having such wavelengths. Also, in order to achieve a high resolution, the fluorite has also come to be required to be a large-diameter single crystal as a glass material for optical component parts.

Conventionally, single-crystal optical materials are produced by a crucible descending method (Bridgman's method). Its typical production system is disclosed in, e.g., U.S. Pat. No. 2,214,976.

FIG. 1 shows a crystal growth furnace provided with upper and lower, two heating units (heaters) which are each independently controllable. Then, a thermocouple 41 is provided at the upper part of a heater 1a to monitor whether or not the temperature at that part is constant.

The system shown in FIG. 1 has a chamber 14, a heat insulator 15 attached to the inner wall of the chamber, and heaters 1a and 1b made of graphite which are disposed on the inside of the heat insulator. A crucible-supporting rod 7 is so provided as to extend through the chamber 14, to support a crucible 3 called a block type crucible. At the beginning, $CaF_2$, a growth material 4 of fluorite, is put in the crucible 3 and the crucible 3 is set at a place surrounded by the heater 1a. The crucible 3 is heated by the heat applied from the heaters 1a and 2a. It is heated to a temperature higher than the melting point of the growth material 4 (e.g., about 1,360° C. in the case of fluorite) and the growth material is melted. The present inventor controlled the heaters of the crystal growth furnace so as to provide a temperature distribution as shown FIG. 2. In FIG. 2, the position in the chamber is plotted as ordinate, and the temperature of the heater as abscissa. As can be seen from Table 2, the system shown in FIG. 1 has such a structure that the temperature becomes low abruptly at a lower end of the heater 1a (the part of height y1). The power applied to the heaters 1a and 1b is so adjusted that the solidifying point of the crystal comes near to the part y1 and also a suitable temperature gradation is provided.

The inside of the chamber 14 constituting the system shown in FIG. 1 is kept at a vacuum of from about $1.33 \times 10^{-3}$ Pa to about $1.33 \times 10^{-4}$ Pa by means of a vacuum pump (not shown). The crucible 3 is descended (optionally with rotation) at a constant rate of about 4 mm/hour, where crystal growth takes place in the crucible 3. The crucible 3 gets away gradually from the heater 1a and is cooled from beneath the crucible 3. Crystallization begins at the bottom having a low temperature and ends when the solid-liquid interface, the boundary of a solid phase and a liquid phase, of a growth point of the crystal reaches the uppermost part of a melt.

In an attempt to produce a large-diameter single crystal by the use of the crystal growth furnace comprising the system constituted as described above, the resultant crystal tends to have a non-uniform refractive index because of a difference in temperature between the center and its neighborhood in the crucible in which the crystal is growing.

FIG. 3 shows a crucible called a disk type, devised in order to achieve a flat isothermal curve. A crucible 3 shown in FIG. 3 is partitioned in plurality with a plurality of plates, called disks 5, having a good thermal conductivity. The disks 5 each have a structure wherein a small hole of several mm in diameter is made at the center. Since the disks 5 have a good thermal conductivity, the temperature of $CaF_2$ can be made flatter than that of the block type crucible shown in FIG. 1, and furthermore the solid-liquid interface can be made flat. In the system having the disk type crucible structured in this way, too, the crucible is gradually descended to make crystallization. The disk type crucible differs from the block type crucible in that a crystal having solidified at the center small hole of a disk 5 of a lower crucible serves sequentially as a seed crystal for an upper crucible. On other points, it is substantially the same as the block type crucible. The whole crucible is descended at a constant rate, and the crystallization of $CaF_2$ is effected between the all disks 5 and is completed when the solid-liquid interface reaches the uppermost part of a melt.

However, since in such conventional processes the heater has a constant heat release value and the crucible is descended at a constant rate, stray crystals tend to occur and also a crystal having a non-uniform refractive index tends to be formed.

The conventional processes, in which the temperature is detected at one point, also involves a poor controllability for temperature distribution at a plane that intersects the direction of crystal growth.

Moreover, if a thermocouple having metal wires made of platinum and a platinum alloy is used to detect temperature, the thermocouple may deteriorate to make it difficult to detect temperature in a high precision. In some other case, lead wires connected to the metal wires of the thermocouple may deteriorate to make it unable to detect temperature in a high precision.

SUMMARY OF THE INVENTION

An object of the present invention is to provide an apparatus, and a process, for producing a crystal article, which apparatus and process may hardly cause stray crystals and can achieve a uniform refractive index distribution.

Another object of the present invention is to provide an apparatus, and a process, for producing a crystal article, which apparatus and process enable good temperature control of growth materials to be put to crystal growth.

Still another object of the present invention is to provide a thermocouple, a thermometer or an apparatus, and a process, for producing a crystal article, which are improved in the durability of a temperature detector and enable temperature detection in a high precision.

The present invention provides an apparatus for producing a crystal article, comprising a crystal growth furnace having a crucible for holding a growth material, a heater for melting the growth material held in the crucible and a moving means for moving the crucible relatively to the heater; the growth material melted in the crucible being cooled to effect crystal growth, wherein;

the crystal growth furnace is;

provided with a detector for detecting temperature of the growth material; and controlled on the basis of changes in temperature detected by the detector.

In another embodiment of the apparatus, the present invention provides an apparatus for producing a crystal article, comprising a crystal growth furnace having a crucible for holding a growth material, a heater for melting the growth material held in the crucible and a moving means for moving the crucible relatively to the heater; the growth material melted in the crucible being cooled to effect crystal growth, wherein;

the crystal growth furnace is;

provided with a plurality of detectors for detecting temperature of the growth material, which are provided in a plane that intersects the direction of crystal growth; and controlled on the basis of the temperature detected by the plurality of detectors; being so controlled that the isothermal face of the growth material is kept convex on the side of a liquid phase.

In still another embodiment of the apparatus, the present invention provides an apparatus for producing a crystal article, comprising a crystal growth furnace having a crucible for holding a growth material, a heater for melting the growth material held in the crucible and a moving means for moving the crucible relatively to the heater; the growth material melted in the crucible being cooled to effect crystal growth, wherein;

the crystal growth furnace is;

provided with a measuring means for measuring the rate of heat flow in the crystal growth furnace; and controlled on the basis of changes in heat flow rate measured with the measuring means.

In a further embodiment of the apparatus, the present invention provides an apparatus for producing a crystal article, comprising a crystal growth furnace having a crucible for holding a growth material, a heater for melting the growth material held in the crucible and a moving means for moving the crucible relatively to the heater; the growth material melted in the crucible being cooled to effect crystal growth, wherein;

the crystal growth furnace is;

provided with a detecting means for detecting generation of latent heat of the growth material; and controlled on the basis of information given from the detecting means on the generation of latent heat.

The present invention also provides a process for producing a crystal article by means of the above apparatus.

The present invention still also provides a thermocouple provided in a crystal growth furnace for growing a fluoride crystal, the thermocouple comprising a pair of metal wires formed of materials different from each other, and a tube provided around at least one of the metal wires;

the tube comprising a metal composed chiefly of tantalum, or a compound composed cheifly of aluminum oxide.

Thus, in a still further embodiment of the apparatus, the present invention provides an apparatus for producing a crystal article, comprising a crystal growth furnace having a crucible for holding a growth material, a heater for melting the growth material held in the crucible and a moving means for moving the crucible relatively to the heater; the growth material melted in the crucible being cooled to effect crystal growth, wherein;

the crystal growth furnace is;

provided with a thermocouple comprising a pair of metal wires formed of materials different from each other, and a tube provided around at least one of the metal wires; the tube comprising a metal composed chiefly of tantalum or a compound composed chiefly of aluminum oxide; and controlled on the basis of temperature information attributable to the thermocouple.

The present invention still further provides a temperature measuring system for measuring temperature of a moving object by means of a thermocouple, wherein;

a connecting part where metal wires and lead wires of the thermocouple are connected and the lead wires are so provided that the temperature at a position where the connecting part and the lead wires are provided is held at 500° C. or below.

The present invention still further provides a temperature measuring system for measuring by means of a thermocouple the temperature of a moving object provided in a chamber the inside of which is kept vacuum;

the system comprising means by which a feedthrough for extending the thermocouple outside from the chamber is moved together with the moving object.

The present invention still further provides a feedthrough of a thermocouple, used to extend the thermocouple outside from a chamber the inside of which is kept vacuum, the feedthrough comprising;

a feedthrough frame provided at one end of the chamber;

at least one cylinder set in the frame, formed of an insulating material and provided with a through-hole in its axial direction; a metal wire or extension lead wire being passable through the through-hole, which through-hole is sealable with an insulating adhesive after the metal wire or extension lead wire has been passed through; and an O-ring provided at least between the cylinder and the feedthrough frame in which the cylinder has been set, to keep the inside of the chamber vacuum.

DESCRIPTION OF THE PREFERRED EMBODIMENTS (Supercooling)

Figure 4A:
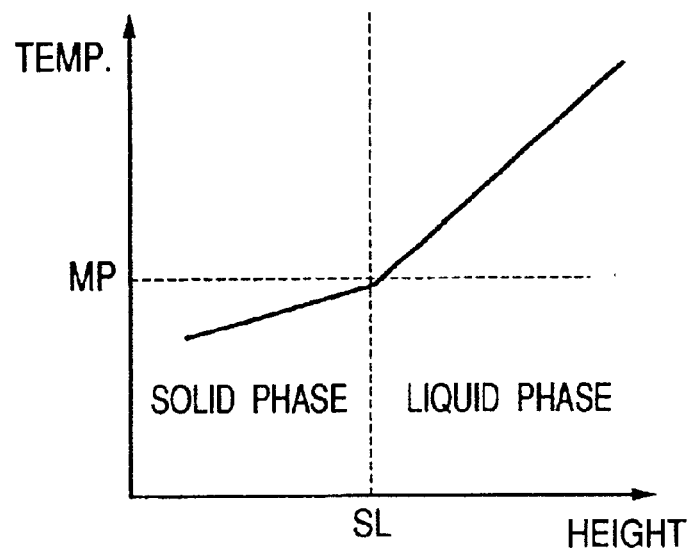
FIG. 4A and FIG. 4B are graphs showing the relationship between height from the bottom of a crucible and temperature, of a crystal growth material.
Figure 4B:
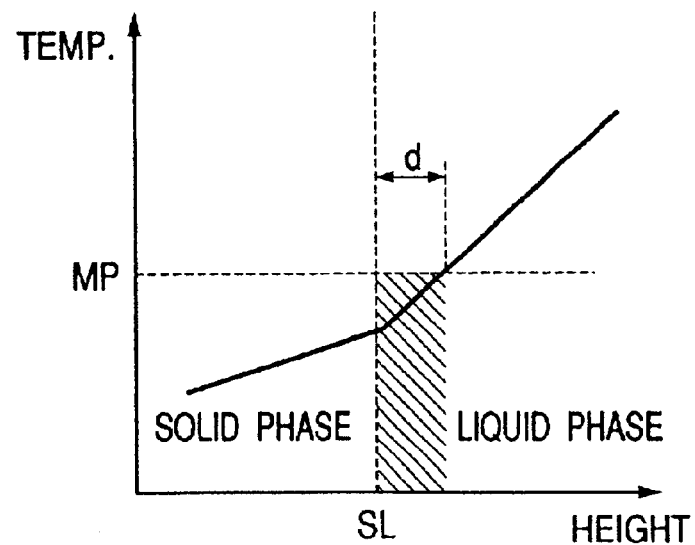

Where a crucible stands still and no additional crystal growth is effected, its temperature gradation in the direction of crystal growth (the vertical direction in FIG. 1) is as shown in FIG. 4A. In FIG. 4A, the height of a growth material is plotted as abscissa and temperature as ordinate. MP represents a melting point, and SL a solid-liquid interface.

Where the crucible is descended and crystal growth is effected, its temperature distribution in the case where the moving rate of a melting temperature line is higher than the deposition rate of a solid phase is as shown in FIG. 4B. In the liquid phase, a temperature region (thickness: d; the region shaded in FIG. 4A) of temperature lower than the melting point MP is present. This region is in the state of supercooling and stands unstable. Hence, there may deposit more crystal nuclei than in the usual liquid phase standing in the vicinity of the solid-liquid interface, and its crystal orientation becomes arbitrary, so that stray crystals come to grow which have an orientation different from the crystal orientation of the solid phase having grown until that time.

In order to prevent such stray crystals, it is important to make the moving rate of a melting temperature line equal to the deposition rate of a solid phase and to make small the thickness d of the region present in the state of supercooling. For this end, it is necessary to make large the temperature gradation in the vicinity of the solid-liquid interface and to control the rate of descending the crucible (hereinafter often "crucible-descending rate") so as to make the moving rate of a melting temperature line equal to the deposition rate of a solid phase.

In conventional processes, however, the crucible-descending rate is not in agreement with the rate of crystal growth (hereinafter often "crystal growth rate"), and the state of supercooling is not found even though it has occurred.

Accordingly, a first embodiment of the present invention is characterized in that "temperature change" ΔT caused by latent heat as will be detailed below is detected so that the crystal growth furnace can be controlled in accordance with the information to be obtained.

(Latent Heat)

Figure 5A:
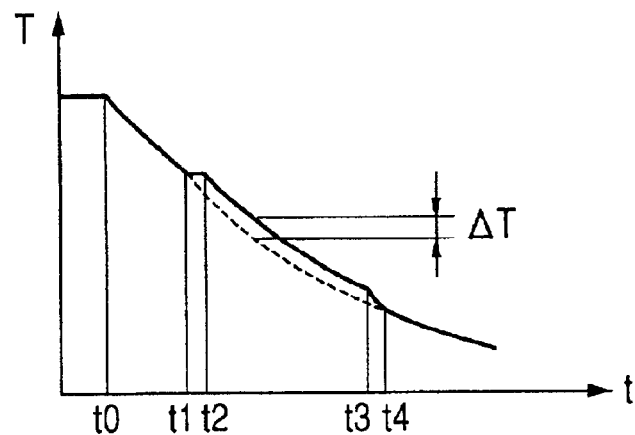
FIG. 5A is a graph showing changes with time of temperature of the growth material in the course of crystal growth processing.

FIG. 5A shows changes with time of temperature of a growth material being subjected to crystal growth processing.

Figure 1:
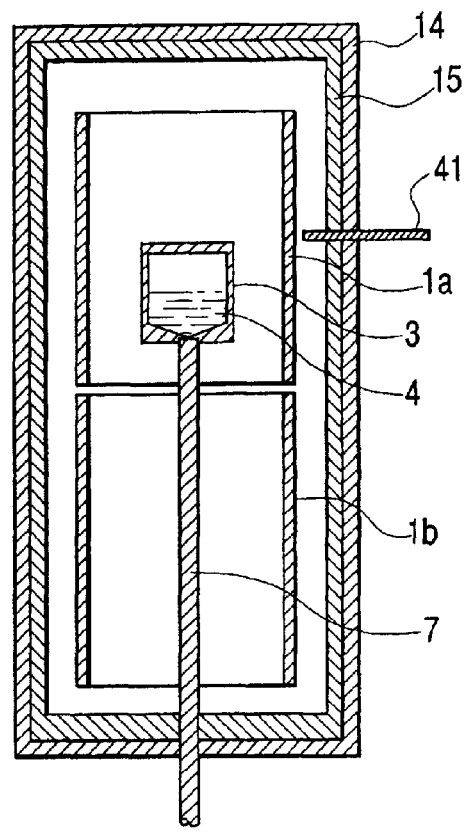
FIG. 1 is a diagrammatic cross-sectional view of a conventional crystal growth apparatus.
Figure 2:
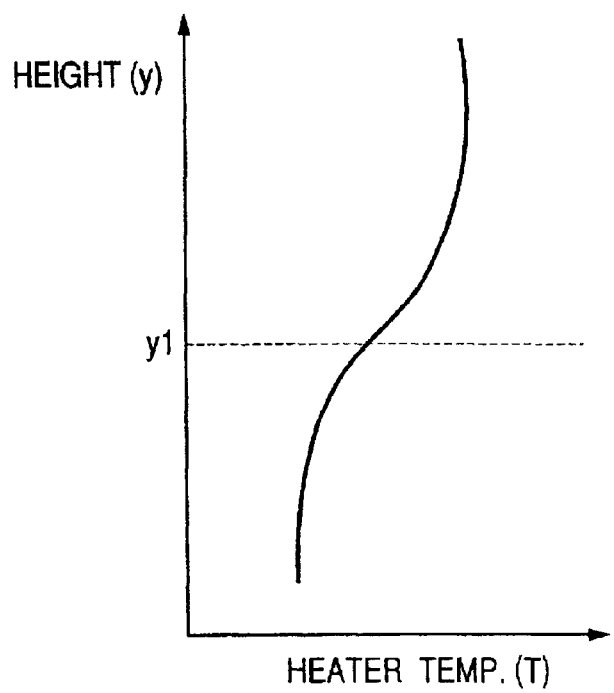
FIG. 2 is a graph showing temperature distribution in a crystal growth furnace.

A temperature detector is set in a crucible of the apparatus shown in FIG. 1 and the crucible is descended, whereupon the detected temperature changes as shown by a solid-line curve in FIG. 5A. This curve has several points of inflection, and each of these points of inflection has been found to be the time that corresponds to crystal growth. Stated specifically, after the crucible begins to be descended at a time t0, crystal growth begins at a time t1 and the crystal growth ends at a time t4. Stated more specifically, crystal growth begins at a time t1 from one point at the center of the bottom of the crucible, the crystal growth extends to the whole interior of the crucible at a time t2, the crystal growth of the growth material present at the center and in its vicinity ends at a time t3, and the crystal growth of the whole growth material in the crucible is completed at a time t4.

When no crystal growth takes place, the curve is as shown by a broken line in FIG. 5A. The data plotted by this broken line can be supported by the following experiment.

For example, $CaF_2$ is used as the growth material and a substance having the same thermal properties (the product of heat capacity C and density ρ) and also have no melting point at 1,000 to 1,500° C. is put in the crucible as an imitation material, and the temperature is measured. Thus, the data corresponding to the broken line can be obtained. Also usable as the imitation material are carbon, MgO and $Al_2O_3$ as shown in the following Table 1. Mixtures of solids of these or mixtures of powders of these are also usable as imitation materials having thermal properties close to $CaF_2$.

TABLE 1

|  | Heat capacity C (J/gK) | Density ρ (g/cm³) | C · ρ (J/cm³) |
| --- | --- | --- | --- |
| $CaF_2$ | 1.28 | 3.0 | 3.8 |
| Carbon | 1.92 | 1.8 | 3.5 |
| MgO | 1.31 | 3.4 | 4.4 |
| $Al_2O_3$ | 3.79 | 1.3 | 4.8 |

Figure 5B:
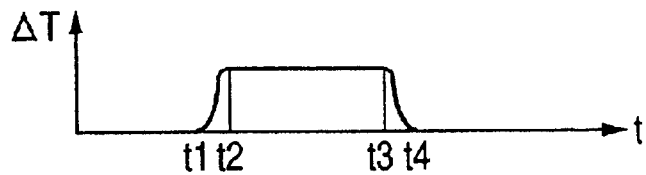
FIG. 5B is a graph showing the relationship between temperature change $\Delta T$ and time, the former being caused by latent heat of the growth material in the course of crystal growth processing.
Figure 5C:
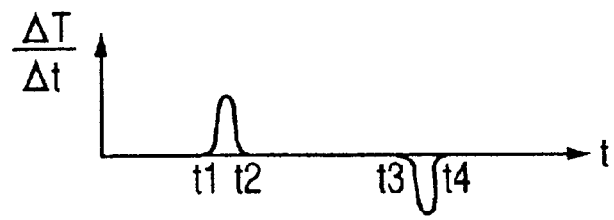
FIG. 5C is a graph showing temperature change $\Delta T$ per unit time.

The ΔT is a difference between the data plotted by the solid line and the data plotted by the broken line, i.e., a temperature difference at an identical time. Changes with time of this ΔT are shown in FIG. 5B. A value of ΔT/Δt indicates a change in temperature difference per unit time, and changes with time of this ΔT/Δt are shown in FIG. 5C.

Where the crystal growth takes place, the growth material undergoes phase transition from a liquid phase to a solid phase to generate latent heat. This latent heat brings about a temperature rise of the growth material, of the crucible and also of the heater. This is the cause of the temperature difference ΔT. Compared with the case where no latent heat is generated (i.e., the case of the data shown by the broken-line), the temperature detected changes only by ΔT. Accordingly, the ΔT is hereinafter called "temperature change" for convenience.

(Control of Crystal Growth Furnace)

In order to make the above region of supercooling small, it is preferable to keep the crystal growth rate constant and/or to control temperature in the vicinity of the solid-liquid interface. How to find the crystal growth rate and the position of solid-liquid interface, which are known from the latent heat as a parameter, will be described firstly. How to make control will be described secondly.

(1) How to find the crystal growth rate and the position of solid-liquid interface:

(1.1) How to find the crystal growth rate:

How to find the temperature change ascribable to latent heat will be described later. First, how to find the crystal growth rate from the temperature change ascribable to latent heat will be described.

Where the crystal growth takes place, phase transition takes place from a liquid phase to a solid phase, so that latent heat is generated. Measurement of this latent heat enables measurement of the crystal growth rate. It has been found that the generation of latent heat brings about a slight temperature rise of the crucible and heater and the temperature having thus risen is proportional to the crystal growth rate. More specifically, it can be expressed as:

$$\Delta T = C1 \cdot Q \cdot dV/dT \quad (1)$$

Figure 6:
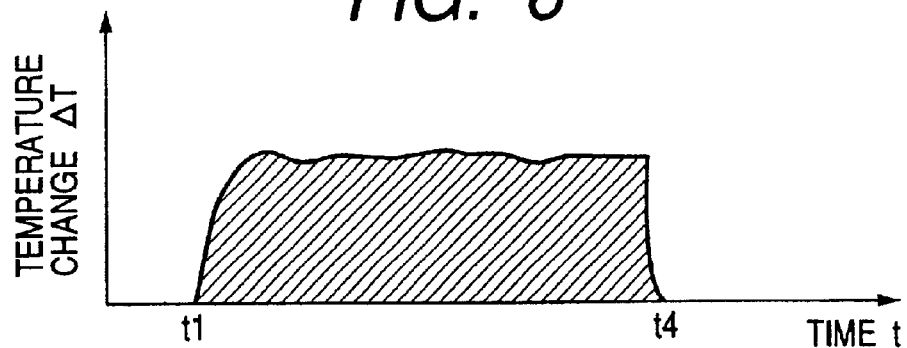
FIG. 6 is a graph showing the relationship between temperature change ΔT and time.

Here, Q is an amount of heat generated when $CaF_2$ per unit volume solidifies, i.e., the heat of fusion per unit volume, and V is a volume of the crystal. dV/dT is a volume of the crystal having increased per unit time. Also, C1 is a proportionality factor, which depends on the structures of the crystal growth furnace and crucible and is determined from the value obtained when the latent heat generated in the crucible is dissipated to the outside (atmosphere or cooling water), thus this factor may be assumed to be constant as long as the same crystal growth furnace and crucible are used. This proportionality factor can also be found by calculation, but an experimental method for its determination will be described below.

Where the growth material in the whole crucible has been solidified, the temperature change ΔT ascribable to latent heat is as shown in FIG. 6. In FIG. 6, the time is plotted as abscissa and the value of temperature rise as ordinate. It is considered that solidification has begun at a time t1 and the solidification of the whole growth material has ended at a time t4. The temperature change ΔT may slightly vary depending on the time. This shows that the latent heat varies with the time. Since, however, the amount of latent heat finally generated depends on the whole volume of the crystal produced, the area of a shaded region shown in FIG. 6 is equal to the whole volume of the crystal having solidified. Accordingly, integrating the both-hand members of Equation (1) from the time t1 to the time t4 gives the following equation.

$$\int \Delta T dt = C1 \cdot Q \cdot V0 \quad (2)$$

Here, V0 is the whole volume of the crystal having solidified. Therefore, the undetermined constant C1 in Equation (1) is determined.

Where $C0 = \int \Delta T dt / dV$, the ΔT is expressed by Equation (3).

$$\Delta T = C0 \cdot dV/dt \quad (3)$$

In the case of a crucible having a flat bottom and where the bottom area of the crucible is represented by S and the thickness of the crystal having grown by h, $$V = S \cdot h \quad (4).$$

Hence, where the both-hand members are differentiated and the resultant value is substituted for Equation (1), the following can be put down.

$$\Delta T = C0 \cdot S \cdot dh/dt \quad (5)$$

Where the crystal growth rate is set as a rate at which the crystal becomes thick, (dh/dt), the following equation is given.

$$dh/dt = \Delta T/(C0 \cdot S) \quad (6)$$

Therefore, as long as the ΔT is found, the crystal growth rate becomes known.

Next, the position of the solid-liquid interface with respect to the crystal growth furnace is found from Equation (6). Since the growth material begins to solidify at the position where the temperature is lowest, the crystal growth begins at the bottom of the crucible when the crucible is descended. Where the time at which the crystal has begun to solidify is represented by t1 and the position of the bottom of the crucible with respect to the crystal growth furnace (e.g., the height measured from the bottom of the chamber) by y0, the position of the solid-liquid interface at a time t, y(t), is expressed by the following Equation (7). In the following, the range of integration is set from the time t1 (crystal growth beginning time) to the time t.

$$y(t) = \int (dh/dt)dt + y0 \quad (7)$$
$$= \int \Delta T/(C0 \cdot S)dt + y0$$

How to find the time t1 at which the crystal growth begins will be described below in combination with how to find the temperature change ΔT.

Figure 7:
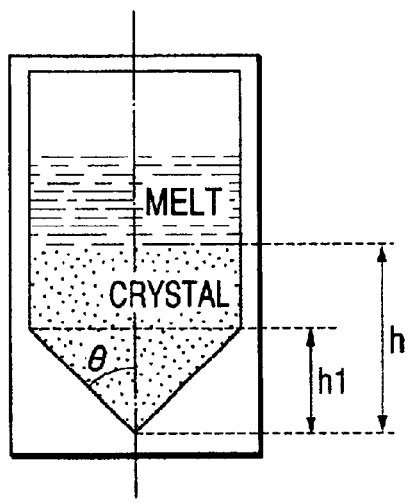
FIG. 7 is a diagrammatic view used to describe the rate of crystal growth.

As shown in FIG. 7, a crucible is available the bottom of which has a conical shape so that the crystal growth may readily proceed from the center of the crucible. In this case, Equation (6) can not be used as an equation for the crystal growth rate when it takes an innegligible time until the crystal growth reaches a height h1. In the case of such a conical crucible, where the half vertical angle of the conical shape around the bottom of the crucible is represented by θ and the height of the conical shape by h1, $$V = (1/3) \cdot \pi \cdot h^3 \tan^2\theta \quad (8).$$

Thus, where the resultant value is substituted for Equation (3), the following is given when h<h1.

$$\Delta T = C0 \cdot h^2 \cdot \tan^2\theta \cdot dh/dt \quad (9).$$

Therefore, within the range of h<h1, the crystal growth rate can be expressed by Equation (10).

$$dh/dt = \Delta T/(C0 \cdot h^2 \cdot \tan^2\theta) \quad (10).$$

Where the height h of the crystal has become greater than h1, the crystal growth rate is given by Equation (6). In Equation (6), S is a cross-sectional area of the crucible at its height greater than h.

(1.2) How to find the temperature changes ascribable to latent heat:

How to find the temperature change ΔT ascribable to latent heat will be described. Methods of measuring the temperature change ΔT can roughly be grouped into two methods. In the following, a method in which the temperature change ΔT ascribable to latent heat is derived from the temperature of the crucible is described first, and next a method in which the temperature change ΔT ascribable to latent heat is derived from the temperature of the heater and so forth.

(1.2.1)

Method in which the temperature change ΔT ascribable to latent heat is derived from the temperature of the crucible:

As described previously, the temperature of the crucible on movement is measured and its changes with time is observed, thus the temperature change ΔT is found.

(1.2.2)

Method in which the temperature change ΔT ascribable to latent heat is derived from the temperature of the heater:

Not the heater does supply heat to the crucible in a one-way fashion, but the crucible and the heater perform heat exchange by radiation. Thus, the temperature rise of the crucible leads directly to the temperature rise of the heater. Meanwhile, since the heater is set stationary, a temperature change such that the temperature lowers gradually as in the case of the crucible is not observable in the temperature of the heater. A rise of temperature of the crucible brings about a rise of the temperature of the heater correspondingly. Hence, as long as the amount of offset is excluded, substantially the same temperature change ΔT ascribable to latent heat as that shown in FIG. 5B is obtainable. Here, the part of the heater at its position corresponding to the vicinity of the bottom of the crucible undergoes changes in temperature as the crucible is moved. Hence, it is preferable to measure the temperature of the heater at its position higher than the bottom of the crucible.

The temperature change ΔT obtained by either of the above methods is integrated by time to find the proportionality factor C0 of Equation (1). Since the temperature change ΔT ascribable to latent heat changes depending on measurement conditions, it is desirable for the proportionality factor C0 to be found every time the measurement conditions are changed as in the case where the temperature of the crucible is measured or when the temperature of the heater is measured.

The position of the solid-liquid interface can also be found according to Equation (7).

The position of the solid-liquid interface in the course of crystal growth can also be found according to Equation (7).

(2) How to make control:

A method of controlling the crystal growth furnace to prevent the stray crystals from occurring will be described below, which is controlled on the bases of the crystal growth rate and the position of the solid-liquid interface which are found as described above.

(2.1) Control made when the crystal growth begins:

In the case where the crystal growth (solidification of the growth material) does not begin even though the temperature of the crucible at its bottom has reached the melting point of the crystal or the bottom of the crucible has reached a predtermined locaion corresponding to the melting point, an increase of the supercooling region may result if the crucible is continued being descended as it is. In such a case, discontinuous change does not occure in the temperature. Accordingly, not the crucible-descending rate is made constant, but the crucible-descending rate is made changeable. Stated specifically, the descending rate is lowered or the crucible is stopped descending to wait for the crystal growth to begin. Alternatively, the temperature of the crucible at its center may be lowered to prompt the crystal growth to begin. Still alternatively, the crucible may gently be shocked by vibration or rotation thereof so that the crystal growth may begin with ease.

(2.2) Control to keep the crystal growth rate constant:

An instance where the crystal growth rate (dh/dt) given by Equation (6) becomes small even though the temperature of the heater is constant and a crucible-descending rate Vc is constant shows that the region of supercooling has increased, i.e., that the crucible-descending rate is too high for the rate of crystal growth. Accordingly, the crucible-descending rate Vc is once lowered. Thus, the crucible-descending rate is controlled so as to be in agreement with the crystal growth rate (dh/dt) so that the region of supercooling can be made small and any occurrence of stray crystals having grown from crystal nuclei having appeared unwontedly can be prevented.

In order to keep the crystal growth rate constant, the crucible-descending rate may be controlled so that the crystal growth rate does not change at all (change is 0). The change of the crystal growth rate can be found by obtaining the differential or difference of the function shown in FIG. 5A, with respect to time. Obtaining the difference of the function shown in FIG. 5A brings what is shown in FIG. 5B. The time is plotted as abscissa, and the temperature rise difference (ΔT/Δt) as ordinate. In the period of from the time t0 to the time t1, the temperature lowers simply by constant degrees as the crucible is descended. The period of from the time t1 to the time t2 is a period where the crystal growth begins and is a period where the temperature greatly changes because of the latent heat. The period of from the time t2 to the time t3 is a period where the crystal growth is kept proceeding at a constant rate. The period of from the time t3 to the time t4 is a period where the crystal growth ends.

(2.3) Heater temperature control in the vicinity of the solid-liquid interface:

In the case where the height y(t) of the solid-liquid interface, obtained by Equation (7), has shifted to deviate from the original temperature, control is so made as to change the temperature of the heater, i.e., the temperature distribution in the crystal growth furnace so that the temperature in the vicinity of the height y(t) of the solid-liquid interface comes to be the melting point.

Another embodiment of the present invention is characterized in that changes in heat flow rate which are caused by latent heat are detected so that the crystal growth furnace can be controlled in accordance with the information to be obtained.

(3) how to find the crystal growth rate and the position of solid-liquid interface:

(3.1) How to find the crystal growth rate:

Where the crystal growth takes place, a phase transition takes place from a liquid phase to a solid phase, so that latent heat is generated. Since this latent heat is proportional to the amount in which the phase transition has taken place from a liquid phase to a solid phase, measurement of this latent heat enables measurement of the crystal growth rate. Where the latent heat has been generated, heat must be made to escape outside in excess for the amount of the heat generated. Hence, the amount of heat escaping outside from the crystal growth furnace increases. The rate of crystal growth can be kept constant as long as the rate of heat flow (heat flow rate) per unit time can be kept constant; the rate corresponding to the amount of heat escaping outside. The change in heat flow rate Vq of the heat escaping outside can be expressed by the following equation.

$$\Delta Vq = C2 \cdot Q \cdot dV/dt \tag{11}$$

Figure 8:
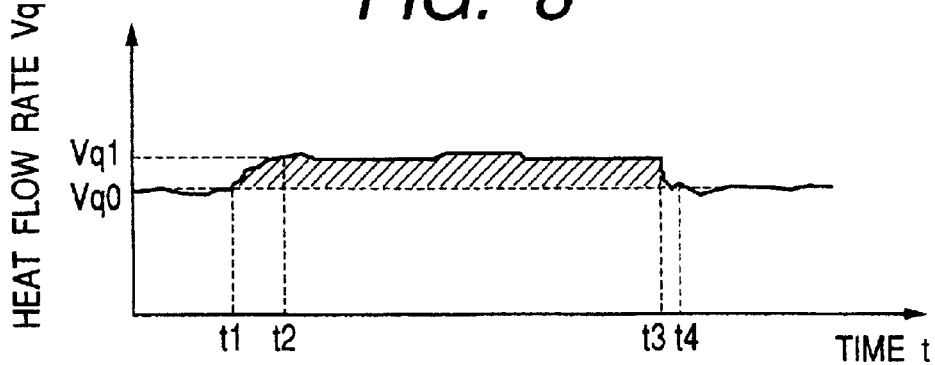
FIG. 8 is a graph showing the relationship between heat flow rate and time.

The amount of change in heat flow rate, $\Delta Vq$, differs at every part of the crystal growth furnace. For example, it is large at a supporting rod which supports the crucible, and is small in the neighborhood of the crucible. Accordingly, the heat flow rate Vq shown here is set as a heat flow rate at a particular point in the crystal growth furnace. In the equation, Q is an amount of heat generated when a growth material per unit volume solidifies, i.e., the heat of fusion per unit volume, and V is a volume of the crystal. dV/dT is a volume of the crystal having increased per unit time. Also, C2 is a proportionality factor, which depends on the structures of the crystal growth furnace and crucible and is determined from the value obtained when the latent heat generated in the crucible is dissipated to the outside (atmosphere or cooling water), thus this factor may be assumed to be constant as long as the same crystal growth furnace and crucible are used. This proportionality factor can also be found by calculation, but an experimental method for its determination will be described below.

Where the growth material in the crucible has been solidified, the heat flow rate Vq is as shown in FIG. 8. In FIG. 8, the time is plotted as abscissa and the heat flow rate as ordinate. It is considered that solidification has begun at a time t1 and the solidification of the whole growth material has ended at a time t4. Before the time t1, the growth material does not begin to solidify, and the heat flow rate of the heat generated when the heat given by a heater provided internally is escaped outside from the crystal growth furnace is Vq0. Where the crystal growth has begun, the amount of heat generated is in excess for the portion of the latent heat. Hence the heat flow rate of the heat driven off outside increases, and the heat flow rate assumes a value substantially close to Vq1. The amount of change in this heat flow rate, $\Delta Vq$ (=Vq(t)−Vq0), is ascribable to the influence of latent heat.

However, the heat flow rate may slightly vary depending on the time. This shows that the latent heat varies with the time. Since, however, the amount of latent heat finally generated depends on the whole volume of the crystal produced, the area of a shaded region shown in FIG. 8 is equal to the whole volume of the crystal having solidified. Accordingly, integrating the both-hand members of Equation (11) from the time t1 to the time t4 gives the following equation.

$$\int (Vq(t) - Vq0) dt = C2 \cdot Q \cdot V0 \tag{12}$$

Here, V0 is the whole volume of the crystal having solidified. Therefore, the undetermined constant C2 in Equation (11) is determined.

Where $C3 = \int (Vq(t) - Vq0) dt / V0$, the $\Delta Vq$ is expressed by Equation (13).

$$\Delta Vq = C3 \cdot dV/dt \tag{13}$$

In the case of a crucible having a flat bottom and where the bottom area of the crucible is represented by S and the thickness of the crystal having grown by h, $$V = S \cdot h \tag{14}$$

Hence, where the both-hand members are differentiated and the resultant value is substituted for Equation (11), the following can be put down.

$$\Delta Vq = C3 \cdot S \cdot dh/dt \tag{15}$$

Where the crystal growth rate is set as a rate at which the crystal becomes thick, (dh/dt), the following equation is given.

$$dh/dt = \Delta Vq/(C3 \cdot S) \tag{16}$$

Therefore, as long as the $\Delta Vq$ is found, the crystal growth rate becomes known.

Next, the position of the solid-liquid interface with respect to the crystal growth furnace is found from Equation (16). Since the growth material begins to solidify at the position where the temperature is lowest, the crystal growth begins at the bottom of the crucible when the crucible is descended. Where the time at which the crystal has begun to solidify is represented by t1 and the position of the bottom of the crucible with respect to the crystal growth furnace (e.g., the height measured from the bottom of the chamber) by y0, the position of the solid-liquid interface at a time t, y(t), is expressed by the following Equation (17). In the following, the range of integration is set from the time t1 (crystal growth beginning time) to the time t.

$$\begin{aligned} y(t) &= \int (dh/dt) dt \\ &= \int \Delta Vq/(C3 \cdot S) dt \end{aligned} \tag{17}$$

How to find the time t1 at which the crystal growth begins will be described below in combination with how to find the temperature change $\Delta T$.

As shown in FIG. 7, a crucible is available the bottom of which has a conical shape so that the crystal growth may readily proceed from the center of the crucible. In this case, Equation (16) can not be used as an equation for the crystal growth rate when it takes an innegligible time until the crystal growth reaches a height h1. In the case of such a conical crucible, where the half vertical angle of the conical shape around the bottom of the crucible is represented by θ and the height of the conical shape by h1, Equation (8) is given as described previously. Thus, where the resultant value is substituted for Equation (13), the following is given when h<h1.

$$\Delta Vq = C3 \cdot h^2 \cdot \tan^2\theta \cdot dh/dt \qquad (18).$$

Therefore, within the range of h<h1, the crystal growth rate can be expressed by the following Equation (19).

$$dh/dt = \Delta Vq/(C3 \cdot h^2 \cdot \tan^2\theta) \qquad (19).$$

Where the height h of the crystal has become greater than h1, the crystal growth rate is given by Equation (16). In Equation (16), S is a cross-sectional area of the crucible at its height greater than h.

(3.2) How to find the changes in heat flow rate, ascribable to latent heat:

How to find the change in crystal growth rate, $\Delta Vq$, ascribable to latent heat will be described. In the case where a solid or gas stands across two points (a point 1 and a point 2) where the heat is transmitted by conduction, the heat flow rate Vq of the heat flowing from the point 1 (temperature T1) to the point 2 (temperature T2) is determined by a temperature gradation between them and a thermal conductivity λ12 between them. Where the distance between the two points is represented by L, $$Vq = \lambda12 \cdot (T2-T1)/L \qquad (20).$$

In the case where a vacuum stands across the two points, the heat is transmitted by radiation. Where the temperatures at the two points are represented by T1 anD T2, $$Vq = C\epsilon \cdot (T1^4 - T2^4) \qquad (21).$$

Here, $C\epsilon$ is a proportionality factor which is determined by the shape factor and emissivity between the two points. In the case where temperature difference $\Delta T$ between the two points ($\Delta T = T1-T2$) is small, Equation (21) is modified to be:

$$Vq\# = 4 \cdot C\epsilon \cdot T2^3 \cdot \Delta T \qquad (22).$$

From Equations (20) to (22), the heat flow rate Vq is determined in all cases except for the proportionality factor, by measuring the temperature at the two points which are spatially distant. Also, by measuring heat flow rate Vq0 before the crystal growth begins, the change in crystal growth rate, $\Delta Vq$ (=Vq−Vq0), can be found. The proportionality factor does not particularly come into question because it is necessarily incorporated into the proportionality factor C3 in Equation (3) when the crystal growth rate is found.

The change in crystal growth rate, $\Delta Vq$, ascribable to latent heat, thus obtained, is integrated by time to find the proportionality factor C2 of Equation (11). Since the change in crystal growth rate, $\Delta Vq$, is based on the heat flow rate between the two points where it is measured, it is a value characteristic between the two points where it is measured, and it changes depending on the place where it is measured.

Hence, the proportionality factor C2 is determined for each place where it is measured and for each method by which it is measured. The position of the solid-liquid interface can also be found according to Equation (17).

(4) How to make control:

A method of controlling the crystal growth furnace to prevent the stray crystals from occurring will be described below, which is controlled on the bases of the crystal growth rate and the position of the solid-liquid interface which are found as described above.

(4.1) Control made when the crystal growth begins:

In the case where the crystal growth (solidification of the growth material) does not begin even though the temperature of the crucible at its bottom has reached the melting point of the crystal or the bottom of the crucible has reached a predetermined position corresponding to the melting point, an increase of the supercooling region may result if the crucible is continued being descended as it is. In such a case, discontinuous change does not occure in the heat flow rate. Accordingly, the crucible-descending rate is made changeable. Stated specifically, the descending rate is lowered or the crucible is stopped descending to wait for the crystal growth to begin. Here, the temperature of the crucible at its center may be lowered to prompt the crystal growth to begin. Alternatively, the crucible may gently be shocked by vibration or rotation thereof so that the crystal growth may begin with ease.

(4.2) Keeping the crystal growth rate constant:

An instance where the crystal growth rate (dh/dt) given by Equation (16) becomes small even though the temperature of the heater is constant and a crucible-descending rate Vc is constant shows that the region of supercooling has increased, i.e., that the crucible-descending rate is too high for the rate of crystal growth. Accordingly, the crucible-descending rate Vc is lowered. Thus, the crucible-descending rate is controlled so as to be in agreement with the crystal growth rate (dh/dt) so that the region of supercooling can be made small and any occurrence of stray crystals can be prevented.

In order to keep the crystal growth rate constant, the crucible-descending rate may be controlled so that the crystal growth rate does not change at all (change is 0).

(4.3) Heater temperature control in the vicinity of the solid-liquid interface:

In the case where the height y(t) of the solid-liquid interface, obtained by Equation (17), has shifted to deviate from the original temperature, control is so made as to change the temperature of the heater, i.e., the temperature distribution in the crystal growth furnace so that the temperature in the vicinity of the height y(t) of the solid-liquid interface comes to be the melting point.

Still another embodiment of the present invention is characterized in that the crystal growth furnace is provided with a plurality of temperature detectors for detecting temperature of the growth material, provided in a plane that intersects the direction of crystal growth, and is controlled on the basis of the temperature detected by the plurality of detectors, i.e., on the basis of the information of temperature distribution; the furnace being so controlled that the isothermal face of the growth material is kept convex on the side of a liquid phase.

In an attempt to produce a large-diameter single crystal by using a crystal growth furnace, the resultant crystal tends to have a non-uniform refractive index because the temperature is different between the center and vicinity of the crucible during the crystal growth. Accordingly, in order to obtain a good single crystal, it is desirable to control temperature distribution in the crucible. This can be explained in the following way.

Until a crystal has grown on the whole bottom of a crucible at which the crystal growth begins from one point at the center of the crucible, it is desirable for the solid-liquid interface to be in an upward convex isothermal curve ("isothermal curve" is herein meant to be a curve as viewed cross-sectionally, formed by connecting in a line the points of equal temperature in the crucible) so that any crystal does not grow from other part such as corners of the crucible. Even a slight disorder of the temperature distribution having such an upward convex isothermal curve may cause crystal growth to begin which does not take place at its center as a seed crystal, so that a polycrystalline product is formed. This must be avoided.

In a crucible the bottom of which has a slightly conical shape, the polycrystalline product may hardly be formed even with such a slight disorder of the temperature distribution having an upward convex isothermal curve. However, making large the half vertical angle of the conical shape brings about a problem that the crucible has structurally a large size and a problem that changes in heat release value ascribable to latent heat, because of a change in cross-sectional area of the crucible that passes a certain position during its descending, or changes in the amount of heat dissipated from a cooling rod may affect temperature distribution of the interior. Accordingly, it is preferable even for the conical crucible to be provided with a temperature distribution having an appropriately upward convex isothermal curve.

Figure 9A:
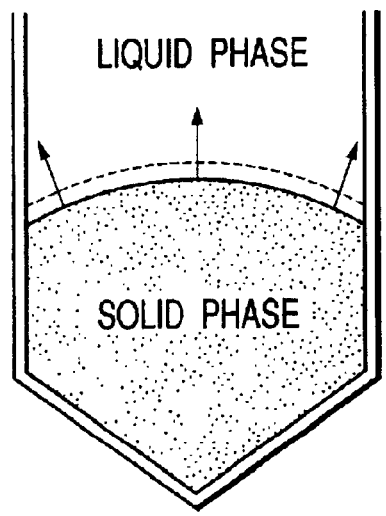
FIG. 9A and FIG. 9B are diagrammatic views showing how solid-liquid interfaces stand.
Figure 9B:
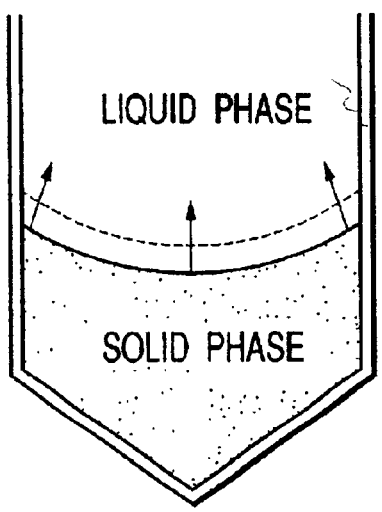

After the crystal has grown on the whole bottom of the crucible, too, it is desirable to provide a temperature distribution that can obtain a slightly upward convex isothermal curve. This is because, when the isothermal curve is slightly upward convex, the solid-liquid interface which is an interface between a liquid phase and a solid phase can be upward convex as shown in FIG. 9A. Hence, any stray crystals produced on the wall surface so behave as to grow in the direction of normals of the interface to become blocked with the sidewall of the crucible. On the other hand, if the isothermal curve is downward convex, the stray crystals produced on the wall or solid-liquid interface grow toward the center of the crucible and do not disappear, and hence any growth of a good single crystal can not be expected. To obtain the upward convex temperature curve, conventional apparatus have, as disclosed in, e.g., U.S. Pat. No. 2,214,976, an additional structure that cooling water is flowed through the crucible-supporting rod to lower the temperature of the crucible at its center and at the same time the crucible-supporting rod is provided with a thermocouple to measure the temperature of the crucible at its center.

However, if the crystal growth is effected in the state the crucible has a temperature distribution in its cross-sectional plane, an internal stress is necessarily produced in the resultant crystal. Moreover, if the isothermal curve is too greatly upward convex, the part having solidified early may cause slippage with its shrinkage and a transition may be brought to the interior of the crucible, making it impossible to produce a uniform crystal. When the intended crystal is not so large in diameter and a plane perpendicular to the direction of crystal growth has a diameter of tens of mm as in conventional cases, the temperature distribution, if any, in the diameter direction of the crystal is not so great, and hence a thermal stress remaining after the crystal growth is also small. However, in an attempt to produce a crystal having an diameter of hundreds of mm, the problem that the resultant crystal has a non-uniform refractive index may remarkably occur because of a difference in temperature between the crucible center and its neighborhood during the crystal growth. Also, depending on the extent of temperature distribution, the crystal may crack.

As described above, a large-diameter single crystal having a uniform refractive index can be produced as long as the temperature distribution having an upward convex isothermal curve is achieved in the crucible. For this end, however, technical subjects as discussed below must be settled.

Problems on measurement of temperature distribution and temperature control:

In the case of a crucible having a large diameter, the temperature distribution having an appropriately upward convex isothermal curve can not be achieved unless the temperature distribution is strictly controlled.

The apparatus for producing a crystal according to the present embodiment is provided with, e.g., a plurality of thermocouples on the underside of the crucible in its in-plane direction, as a measuring means for measuring at a plurality of spots the temperature in the direction perpendicular to the direction of crystal growth. On the basis of the results of measurement of temperature by this measuring means, the crystal growth furnace is so controlled that the temperature becomes lower toward the center of the crucible. As a means therefor, e.g., cooling water and a heater are used and inputs for these are so controlled that the in-plane equal-temperature portion (herein called "isothermal face") of the growth material can be in the temperature distribution having an upward convex isothermal curve and at the desired value.

From the time at which the crystal growth begins and until the crystal growth begins on the whole bottom of the crucible, the temperature distribution having an upward convex isothermal curve is maintained. After the crystal growth has begun on the whole bottom of the crucible, the crystal growth furnace is so controlled that the extent of the temperature distribution having an upward convex isothermal curve may be gentle and can come close to a temperature distribution having a flat isothermal curve. Thus, the crystal growth can be made to begin always from one point of the crucible center and also the temperature difference between the crucible center and its neighborhood can be kept small. Hence, a uniform crystal having a small internal stress can be obtained. Also, in accordance with the condition of crystal growth that is obtained from the measured data, the crucible-descending rate is so determined and controlled that the crystal growth rate comes in agreement with the crucible-descending rate so that no supercooling may occur.

In order to make such control, it is necessary to know the time at which the crystal growth begins and the crystal growth has begun on the whole bottom of the crucible. Accordingly, that time is detected from the temperature change $\Delta T$ ascribable to latent heat as shown in FIG. 5A.

Figure 3:
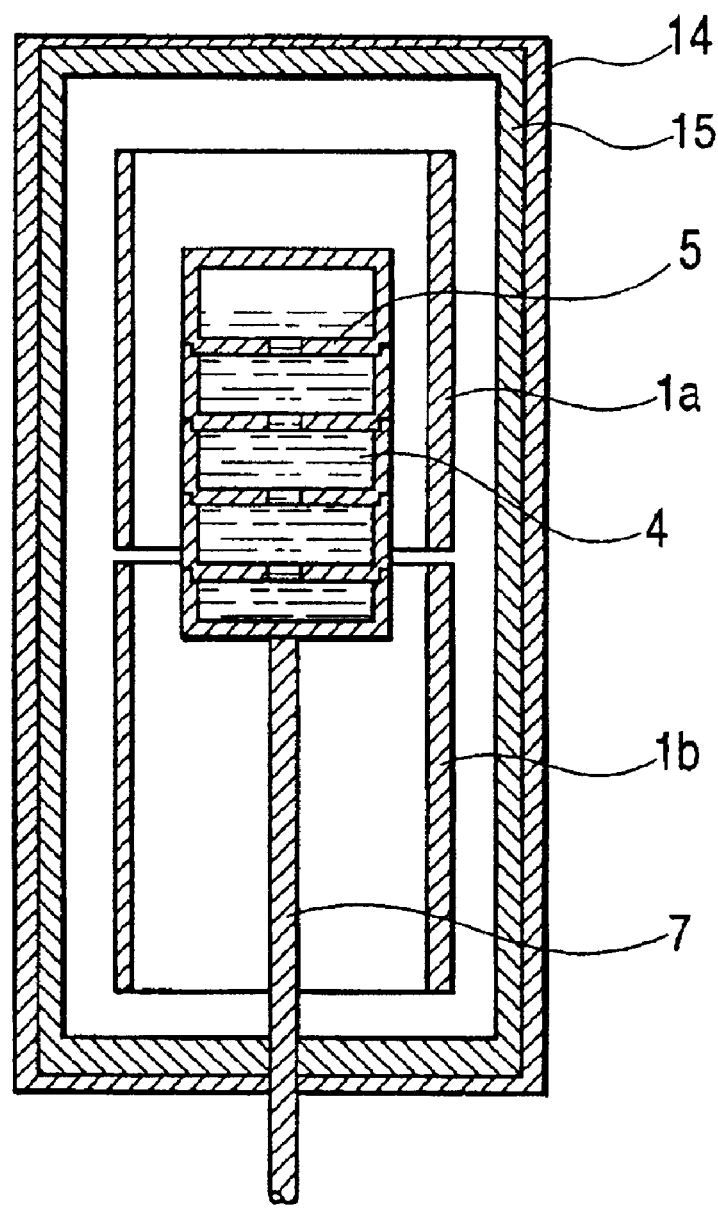
FIG. 3 is a diagrammatic cross-sectional view of another conventional crystal growth apparatus.
Figure 10:
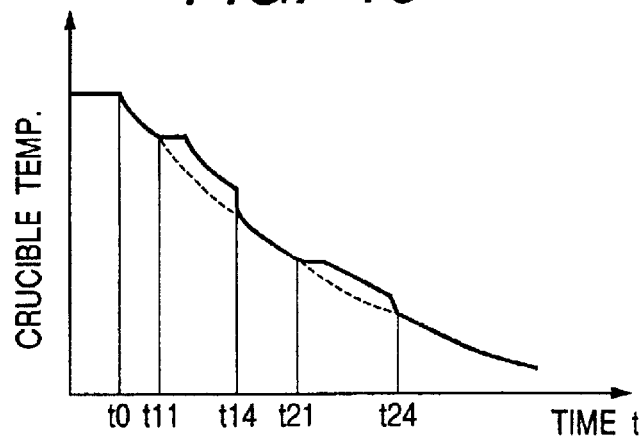
FIG. 10 is a graph showing changes with time of temperature of the growth material in the course of crystal growth processing making use of a crucible above and below partitioned with disks.

In the case of the crucible as shown in FIG. 3, called a disk type crucible, the crystal growth stops at each crucible and the crystal growth again begins as the crucible is further descended. Hence, it follows that the above temperature change is repeated plural times. This can be graphically represented as shown in FIG. 10. A time t11 to a time t14 correspond to crystal growth on the first disk, and a time t21 to a time t24 correspond to crystal growth on the second disk.

The thermocouple of the present invention is characterized in that a tube composed chiefly of tantalum (Ta) or aluminum oxide is provided around at least one of metal wires.

As a method of measuring the temperature, a method making use of a radiation thermometer or a thermocouple is available. In the case where the radiation thermometer is used, the inside spectra must be detected through a sight window or the like provided in the chamber wall. Any contamination of such a window, however, leads to errors of measurement and also it is difficult to measure the temperature of the crucible at a plurality of stages. Accordingly, it is preferred to use the thermocouple.

Since, however, the inside of the crystal growth furnace is at a temperature of 1,500° C. or above and is also an atmosphere of conductive dust comprised of carbon or zinc or a corrosive gas such as hydrogen fluoride (HF), an attempt to dispose the thermocouple in the furnace, in particular, in the crucible involves the following problems.

Sheath tubes of thermocouples are corrosive with HF gas, or no thermocouples have been available which can withstand the measurement, because of the reaction with carbon. Even when a protective tube which can withstand the atmospheric gas is provided around the thermocouple, a plurality of protective tubes must be joined and be bent at the joints when the thermocouple is installed and used in the form of a bend. However, the metal wires of the thermocouple are laid bare at the joints, and hence the metal wires standing bare are exposed to the atmospheric gas to become damaged, or carbon dust may adhere thereto to short-circuit the two metal wires. At any event, it has been difficult to measure accurate temperatures.

Figure 11:
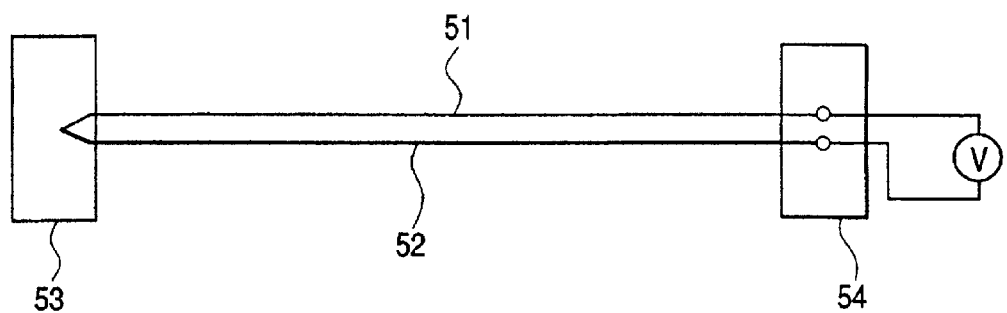
FIG. 11 is a diagrammatic illustration of an example of a thermocouple serving as a temperature detector.

The constitution of a commonly available thermocouple will be described here. The thermocouple comprises, as shown in FIG. 11, two metal wires 51 and 52 formed of materials different from each other, one end 53 of which is welded and the other of which is connected to a voltmeter when used. Voltage to be measured is determined by temperatures at the both ends 53 and 54 of the metal wires 51 and 52.

Figure 12:
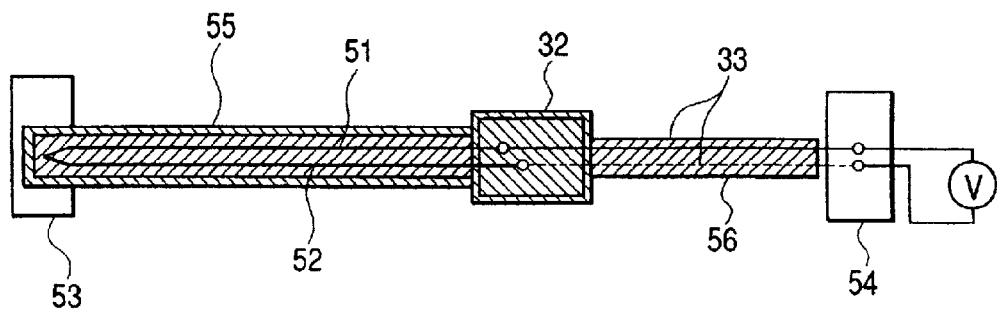
FIG. 12 is a diagrammatic illustration of an example of a thermocouple serving as a temperature detector, used in the apparatus of the present invention.

In such a thermocouple, in order to prevent metal wires from corrosion due to the gas in the measurement atmosphere or prevent the metal wires from short circuit, a sheathed thermocouple as shown in FIG. 12 is used in some cases. This thermocouple comprises a sheath tube 55 internally filled with an insulating material such as beryllia or hafnium oxide, two metal wires 51 and 52 passed through the interior of the sheath tube 55, and a connecting part 32 provided at one end of the sheath tube 55. The metal wires 51 and 52 are connected to lead wires 33 inside the connecting part 32. As the lead wires 33, thermocouple metal wires or extension lead wires are used, which are covered with a covering material 56 such as Teflon or glass fiber. The extension lead wires are made of a metal having substantially the same thermal electromotive force as the thermocouple metal wires, and, though having a smaller heat resistance than the thermocouple metal wires, are superior to the thermocouple metal wires in view of readiness to handle, cost and so forth. Maximum service temperature of the connecting part 32 and lead wires 33 depends on the covering material 56 of the lead wires and the material of the connecting part 32, and is about 500° C. The extension lead wires must also be used in a temperature range where they show the same electromotive force as the thermocouple. Then, the lead wires are connected to a measuring instrument, and the temperature of the sheath tube 55 at a temperature measuring junction at its top 53 is measured.

As the sheath tube 55, a ceramic tube or a tube made of a metal such as molybdenum is selected, having heat resistance and corrosion resistance against the measuring atmosphere. However, where environmental resistance such as heat resistance and corrosion resistance of the thermocouple are required, the sheath tube must have a large diameter to lose flexibility.

Accordingly, in the present embodiment, tantalum, a tantalum alloy or aluminum oxide is used as a material for the sheath tube or protective tube in order to satisfy the heat resistance, corrosion resistance and flexibility at the same time. This is based on the following experimental results.

High-melting materials having a melting point of 1,500° C. or above were actually exposed to HF gas to examine their durability. Also, these were each inserted between carbon plates to inspect their reaction with carbon. Results obtained are shown in Table 2 as a loss in thickness or mass per day.

TABLE 2

| Material | Melting point | Atmospheric during crystal growth | Between carbon plate |
|---|---|---|---|
| Ta | 2,996° C. | 0.0022 mm/day | 0.008 mm/day |
| Mo | 2,610° C. | 0.0017 mm/day | Reacted with carbon |
| Pt | 1,772° C. | Out of original form | Out of original form |
| $Al_2O_3$ (>99%) | 2,050° C. | 3%/day | <3%/day |
| $Al_2O_3$ (55%) | | Out of original form | |

As can be seen from Table 2, it has become apparent that Ta and $Al_2O_3$ (>99% purity) fulfill the conditions that they have a heat resistance and a corrosion resistance against gas in the fluoride crystal growth furnace and do not react with carbon. Thus, it has been found that a sheathed thermocouple comprising a sheath tube made of Ta and/or being a thermocouple comprising a protective tube made of $Al_2O_3$ (>99% purity) is preferable for measuring the temperature of the crucible and heater in the fluoride crystal growth furnace. The metal wires 51 and 52 of the thermocouple may be of any types, which may be selected taking account of the temperature to be measured. For example, in the measurement of temperatures above 1,500° C., usable are a platinum/rhodium platinum thermocouple (specified by symbol B or R of the JIS C1602 standard) and a tungsten/rhenium thermocouple.

The temperature measuring system of the present invention is characterized in that the connecting part of the thermocouple at which the sheathed portion and lead wires are connected is held at 500° C. or below. Here, the lead wire may be a metal wire or extension lead wire made of the same material as that of the thermocouple.

In order to keep the connecting part and lead wires at 500° C. or below, a member cooled to 500° C. or below may preferably be further provided between the top of the thermocouple and the connecting part. Alternatively, a thermocouple casing for holding the connecting part and the lead wires may be set to the cooling member of 500° C. or below. Still alternatively, it is also preferable to dispose the connecting part at a position held at 500° C. or below.

In another embodiment of the temperature measuring system of the present invention, a temperature measuring system for measuring by means of a thermocouple the temperature of a moving object provided in a chamber the inside of which is kept vacuum is characterized in that the system has a means by which a feedthrough for extending the thermocouple outside from the chamber is moved together with the moving object.

When the thermocouple is set to a moving object comprising a crucible and so forth, the thermocouple may deflect with the movement, so that the sheath material (sheath tube) and so forth can not withstand bend or shrinkage, bringing about a possibility that the thermocouple buckles or cracks.

According to the above embodiment, any deflection of the thermocouple with the movement of the crucible can be absorbed by the lead wires even when, e.g., a Ta sheath and/or protective tube composed of Ta, Ta alloy or $Al_2O_3$ are used, which have no flexibility.

The feedthrough of the present invention is a feedthrough of a thermocouple, used to extend the thermocouple outside from a chamber the inside of which is kept vacuum, and is characterized in that;

a feedthrough frame is provided at one end of the chamber;

at least one cylinder is set in the frame, formed of an insulating material and provided with a through-hole in its axial direction; a metal wire or extension lead wire being passable through the through-hole, which through-hole is sealable with an insulating adhesive after the metal wire or extension lead wire has been passed through; and an O-ring is provided at least between the cylinder and the feedthrough frame in which the cylinder has been set, to keep the inside of the chamber vacuum.

Figure 13:
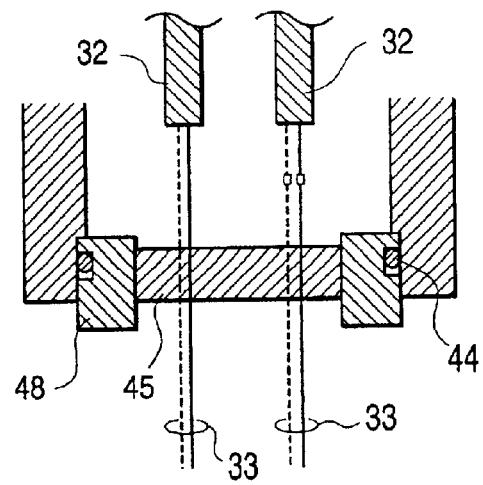
FIG. 13 is a diagrammatic cross-sectional illustration of the structure of a feedthrough of a thermocouple.

To measure the changes in temperature of the crucible, a high measurement precision is required. Especially when the thermocouple is used to measure temperature under such a condition that the inside of a chamber in which furnace members such as the crucible and the heater are installed is kept vacuum, errors in temperature measurement tend to occur at the feedthrough used to extend the thermocouple outside from the chamber. This is due to the chamber the inside of which is kept vacuum and hence does not undergo any temperature variation which may occur in accordance with room temperature. For this reason, a temperature difference is produced between the crystal growth furnace (the inside of the chamber) and the open air (the outside of the chamber), and a thermal electromotive force produced here affects the measurement made by the thermocouple.

Where the metal wires of the thermocouple are extended to the outside of the chamber, a method is available which makes use of a feedthrough comprising, as shown in FIG. 13, a metal frame 48 to which an insulating material 45 such as ceramic (e.g., $Al_2O_3$) or glass has been fixed in such a way that lead wires 33 of the thermocouple, such as metal wires or extension lead wires, are previously fixed so as not to cause any break of vacuum. In such a method, however, it is difficult to change the type of the thermocouple later. Moreover, in an atmosphere where carbon dust is present, the carbon dust may adhere to the feedthrough surface to tend to short-circuit the metal wires to cause measurement errors.

Figure 14:
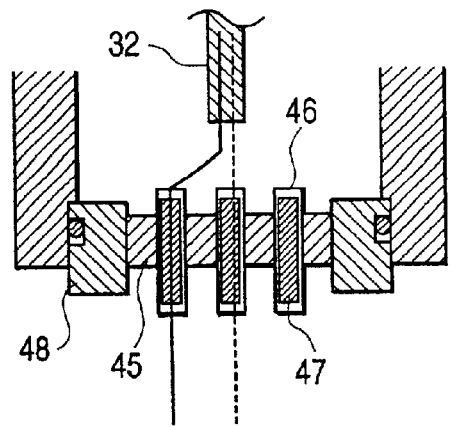
FIG. 14 is a diagrammatic cross-sectional illustration of the structure of another feedthrough.

Meanwhile, where a sheathed thermocouple is extended outside at the sheathed portion, a method is available which makes use of a feedthrough comprising, as shown in FIG. 14, a metal frame 48 to which an insulating material 45 such as ceramic (e.g., $Al_2O_3$) or glass has been fixed in such a way that metal tubes 46 are previously fixed so as not to cause any leak of vacuum. In this case, lead wires are passed through some metal tubes 46, and the space between each metal tube 46 and each lead wire and the inside of an empty metal tube 46 are sealed with solder 47. However, the use of solder 47 causes measurement errors due to an inside-and-outside temperature difference. An adhesive may be used in place of the solder. However, once the thermocouple has been inserted, it is difficult to detach the thermocouple even when the thermocouple is no longer necessary. Besides, there is always a possibility that a contact potential is produced upon break of insulation between the metal tubes and the thermocouple metal wires to cause measurement errors.

Figure 15:
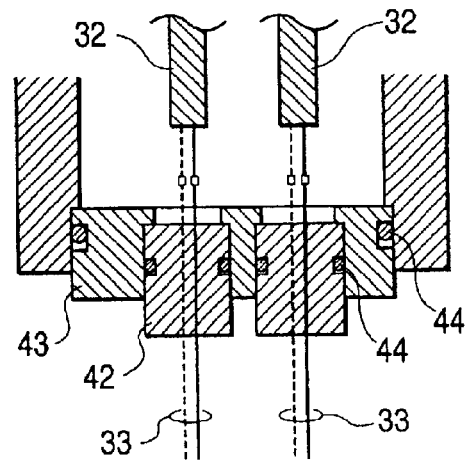
FIG. 15 is a diagrammatic cross-sectional view showing the structure of a feedthrough of the present invention.

In the present invention, to solve such problems, the feedthrough of the thermocouple comprises, as shown in FIG. 15, a feedthrough cylinder 42 formed of an insulating material and provided with a plurality of through-holes (not shown) in its axial direction, through which lead wires are passed. The space between the lead wires and each through-hole of the feedthrough cylinder 42 is vacuum-sealed with an adhesive, and the lead wires of the thermocouple are connected on the side of the chamber. With such constitution, the feedthrough cylinder may previously be prepared in plurality so that the thermocouple can be inserted in a desired number without regard to the types of thermocouples.

In a state where the inside of the chamber is contaminated with carbon dust, the carbon dust may adhere to an O-ring which seal the feedthrough to tend to break vacuum or tend to short-circuit the lead wires at the feedthrough surface. In such a case, the feedthrough may be so disposed that its surface on the side of the chamber to which surface the feedthrough cylinder is set flat-top is in the gravity direction (i.e., vertical direction) or is inclined toward the horizontal direction from the vertical direction.

Specific embodiments of the present invention will be described below first on the apparatus for producing a crystal article according to the present invention.

(Embodiment 1)

Figure 16:
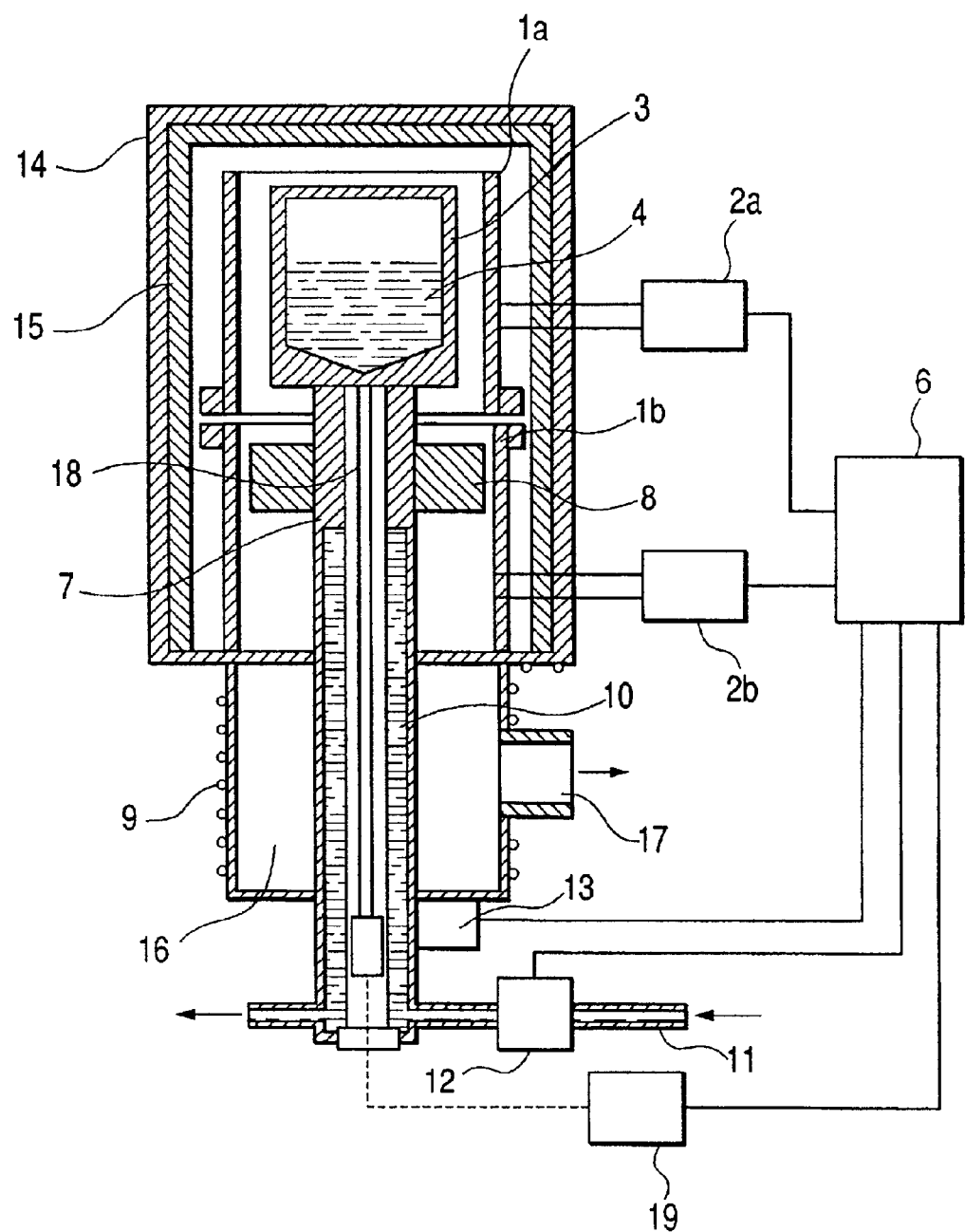
FIG. 16 is a diagrammatic cross-sectional illustration of a crystal growth apparatus according to an embodiment of the present invention.

FIG. 16 is a diagrammatic cross-sectional illustration of a first embodiment of the apparatus according to the present invention. It shows an example of a crystal growth apparatus having a furnace the inside of which is divided into a high-temperature first region (high-temperature region) and a low-temperature second region (low-temperature region), which are each temperature-controlled by a heater independently provided. In the apparatus shown in FIG. 16, the temperature of a crucible at its bottom is measured to control the crucible-descending rate so that the crystal growth furnace can be controlled. Here, the temperature of a crucible at its bottom is regarded as the temperature of a growth material.

In FIG. 16, reference numerals 1a and 1b denote a first heater and a second heater, respectively; 2a and 2b, power sources for the first heater and second heater, respectively; 3, a crucible; 4, a growth material put into the crucible; 6, a control unit; 7, a crucible-supporting rod; 8, a heat-insulating material provided beneath the crucible; 9, piping for a refrigerant; 10, a flow path for the refrigerant; 11, a refrigerant inlet; 12, a flow rate control valve; 13, an up-and-down mechanism for descending the crucible via the crucible-supporting rod 7; 14, a vacuum chamber; 15, a heat-insulating material; 16, an exhaust chamber; 17, an exhaust vent; and 18, a temperature detector such as the thermocouple.

The inside of the vacuum chamber 14, made of a metal such as stainless steel, is evacuated from the exhaust vent 17 through the exhaust chamber 16, and the pressure in the chamber is kept at $1.33 \times 10^{-3}$ Pa to $1.33 \times 10^{-4}$ Pa. The heat-insulating material 15 is attached to the inner wall of the vacuum chamber 14 and has a structure that does not allow the heat generated by the heaters 1a and 1b to escape. The heaters 1a and 1b are formed of a carbon material or the like, and are electrified through the power sources 2a and 2b, respectively, to generate heat. Then, the heat thus generated is supplied by radiation to the crucible 3 placed inside the heaters 1a and 1b. The crucible 3 is made of a substance such as carbon, which does not react with the growth material 4 of a crystal. The growth material 4 of a crystal, such as calcium fluoride, is held in the crucible 3. Also, the crucible-supporting rod 7 for supporting the crucible is set beneath the crucible. The crucible-supporting rod 7 is set to the up-and-down mechanism 13, and the up-and-down mechanism 13 is driven in accordance with instructions given from the control unit 6, thus the crucible 3 is up and down moved.

As a temperature control mechanism different from the heating elements heaters 1a and 1b, the refrigerant flow path 10, through which a refrigerant such as cooling water is flowed, is provided inside the crucible-supporting rod 7. The refrigerant flowed in from the refrigerant inlet 11 flows into the flow path 10 through the control valve 12, takes the heat away from the crucible-supporting rod 7 while passing through the inside of the crucible-supporting rod 7, and is discharged from a discharge outlet. The cooling capacity attributable to the refrigerant commonly depends on the temperature and flow rate of the refrigerant. In the present example, the cooling capacity is determined by the flow rate by controlling the flow rate control valve 12 with the control unit 6. Accordingly, when the temperature of the crucible at its center is too high, the cooling capacity is made higher by opening the flow rate control valve 12, whereby the temperature of the crucible at its center can be lowered.

The thermocouple 18 as a temperature detector is inserted to the crucible-supporting rod 7, and its apex comes into contact with the underside of the crucible 3 so that the temperature of the crucible at its center can be measured. Then, the temperature measured with the thermocouple 18 is inputted to a temperature measuring instrument 19, and temperature information detected in it is forwarded to the control unit 6. Here, the temperature measuring instrument 19 and/or the control unit 6 detects the temperature change $\Delta T$ ascribable to latent heat, and the control unit 6 controls the crystal growth furnace in accordance with the information showing the temperature change $\Delta T$ ascribable to latent heat.

How the apparatus constituted as described above operates will be described below.

First, electric power is supplied to the heaters 1a and 1b, and the crucible 3 is heated, which is kept as it is until the growth material held therein such as $CaF_2$ has melted sufficiently. Since the growth material 4 has a large heat capacity and a small heat release value, it takes few hours to few days after the power of the heaters 1a and 1b has been made constant, until the growth material melts sufficiently and becomes stable. During this melting, the temperature of the crucible 3 at its bottom is measured with the thermocouple 18 set to the underside of the crucible 3. The data of temperature measured are sent through the measuring instrument 19 to the control unit 6, where the temperature of the crucible 3 is recorded. Whether or not the growth material has melted sufficiently and has become stable can be judged from changes with time of the temperature of the crucible 3. When a certain temperature is maintained for a long time, the molten growth material is considered to have become stable.

If the temperature of the crucible 3 at its center does not stand lowest, i.e., if the isothermal curve in the crucible 3 does not stand upward convex, the control unit 6 gives instructions to the power source 2a of the heater 1a so as to increase the electric power and at the same time gives instructions to the flow rate control valve 12 in order to increase the cooling capacity of the crucible-supporting rod 7.

In order to make the growth material solidify while keeping the isothermal curve in the crucible 3 upward convex in temperature distribution, the control unit 6 gives instructions to the up-and-down mechanism 13 so as to descend the crucible 3. Here, the crucible may be descended at a rate of from 0.1 mm/hour to 10 mm/hour. Since, however, the crucible becomes cool more slowly at the center than its outskirts, a too high crucible-descending rate makes the growth material at the center unable to catch up with the lowering of temperature, making it impossible to keep the isothermal curve in the crucible 3 upward convex. In such a case, the crucible-descending rate is made small.

Where the crystal growth has begun, a temperature change occurs in the temperature of the crucible 3 as is shown by the time t1 in FIG. 5A. At this point of time, there is a high possibility that the crystal growth does not begin even though the temperature has reached the melting point, and a large region of supercooling as shown in FIG. 4B has occurred. Accordingly, the crucible-descending rate is made small at the time t1. This can make the supercooling region small. As another means, the flow rate of the cooling water inside the crucible-supporting rod 7 may be so controlled as to increase so that the temperature of the crucible 3 at its center is lowered to prompt the crystal growth to begin. More preferably, the above operation may be made after the crystal growth has taken place and the isothermal curve has become unable to be kept upward convex because of latent heat and so forth. Thus, the isothermal curve can always be kept upward convex.

Next, after the crystal growth has come in a state of the time t2 shown in FIG. 5A, the rate of crystal growth is kept constant. In accordance with the information sent through the temperature measuring instrument 19 to the control unit 6 on the temperature measured with the thermocouple 18 set to the crucible 3, the crystal growth rate (dh/dt) is determined according to how to find the crystal growth rate and position of solid-liquid interface described previously. As a result, when the crystal growth rate has become lower than the crucible-descending rate, the control unit 6 gives instructions to the up-and-down mechanism 13 so as to lower the crucible-descending rate so that the crucible-descending rate comes into agreement with the crystal growth rate. When inversely the crystal growth rate has become higher than the crucible-descending rate, the control may be made so that the crucible-descending rate is made higher to shorten the time of crystal growth.

In this way, after the crystal growth has come in a state of the time t4, the crystal growth is completed. In this course, the crystal growth rate (dh/dt) has changed at the time t3, but it is unnecessary to make precise control because the time t3 is an end-point of the crystal. However, the control may appropriately be made so that the crucible-descending rate does not become low at the time t3. The time at which the crystal growth rate has become small is judged as the end point of the crystal as long as the distance at which the crucible has descended from the position of the time t1 is equal to the length of the crucible in the vertical direction.

The thermocouple may also optionally be provided on the sidewall of the crucible 3 or at the underside of the crucible 3 in order to keep highly precise the temperature distribution where the isothermal curve is slightly upward convex.

(Embodiment 2)

Figure 17:
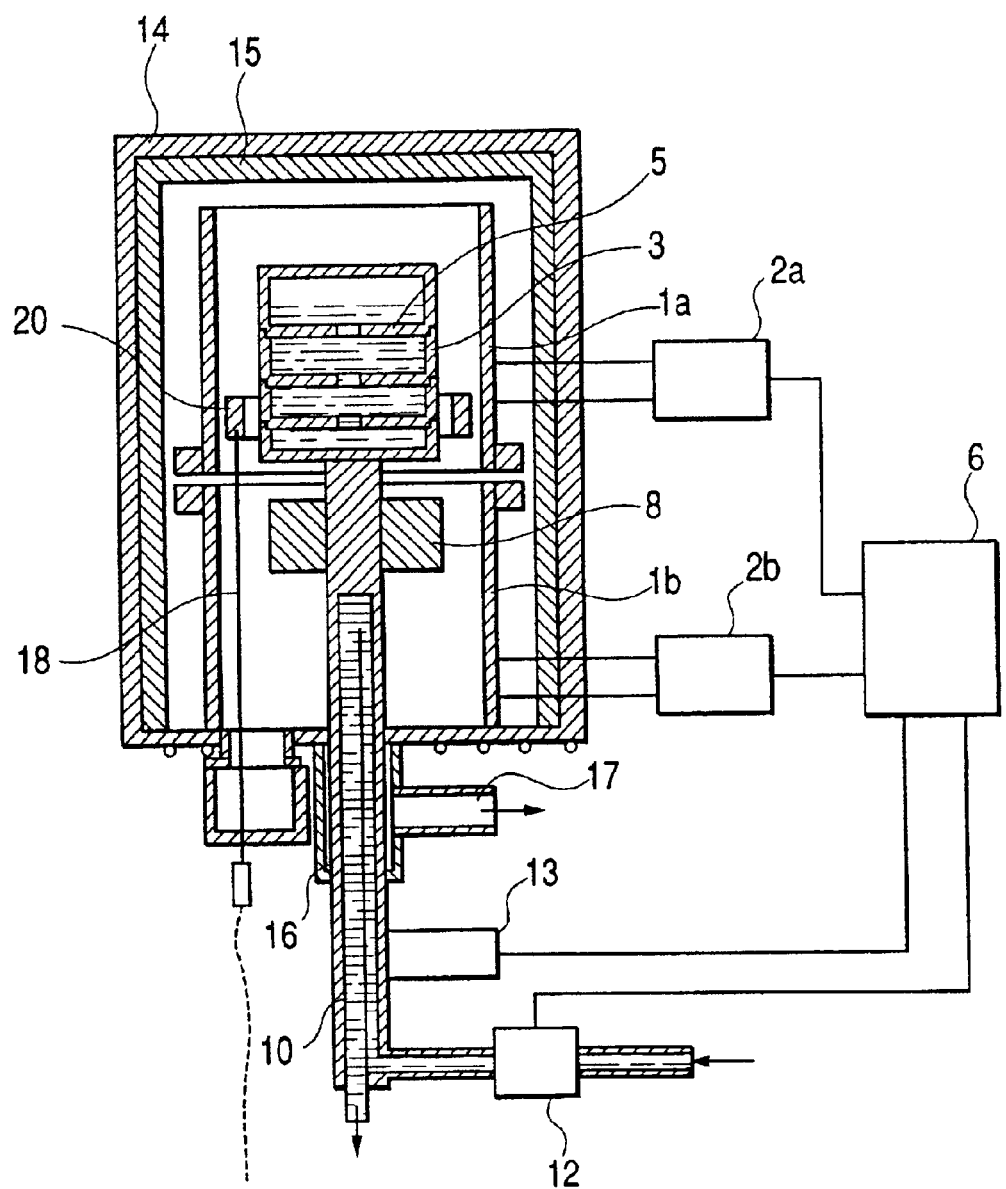
FIG. 17 is a diagrammatic cross-sectional illustration of a crystal growth apparatus according to another embodiment of the present invention.

FIG. 17 is a diagrammatic cross-sectional illustration of a second embodiment of the apparatus according to the present invention. This embodiment is different from Embodiment 1 in that the temperature changes of the growth material are found by measuring temperature changes in the vicinity of the crucible to control the crucible-descending rate (Common constituent members are denoted by like reference numerals). In this embodiment, the temperature in the vicinity of the crucible is regarded as the temperature of the growth material.

In the apparatus of the first embodiment, only a thermocouple rise ascribable to latent heat generated when the growth material crystallizes is measured. Since in such an embodiment the temperature lowers with the movement of the crucible, data processing is required to remove the component corresponding thereto.

In contrast thereto, in the apparatus of the present embodiment, a thermocouple 18 is set to a cylinder 20 for temperature measurement which is provided at a position that may hardly affected by the descending of the crucible 3. A thermocouple 18 for temperature measurement may also be set fixedly at a position where the growth material crystallizes, and the temperature change $\Delta T$ ascribable to latent heat may be found from the results of temperature measurement. With changes of the temperature of the crucible 3, the radiation from the crucible increases to raise the temperature of the cylinder 20 for temperature measurement which is placed in the vicinity of the crucible 3 and is made of, e.g., a carbon material. This makes it possible to immediately obtain the detection result as shown in FIG. 5B, and the rate of descending the crucible 3 is controlled on the basis of this result.

In the present embodiment, the cylinder 20 for temperature measurement is inserted to the space between the crucible 3 and the heater 1a. In the case where the space is small or the thermocouple 18 has a small heat capacity, only the thermocouple 18 may be inserted without providing the cylinder 20, or a non-cylindrical small piece (not shown) for measurement of temperature changes may be provided. The thermocouple 18 may also be set directly to the heater 1a or 1b. In this apparatus, too, the temperature change $\Delta T$ ascribable to latent heat is detected, and the crucible-descending rate is decreased or the flow rate of the refrigerant is increased to control the difference between the crystal growth rate and the crucible-descending rate.

(Embodiment 3)

Figure 18:
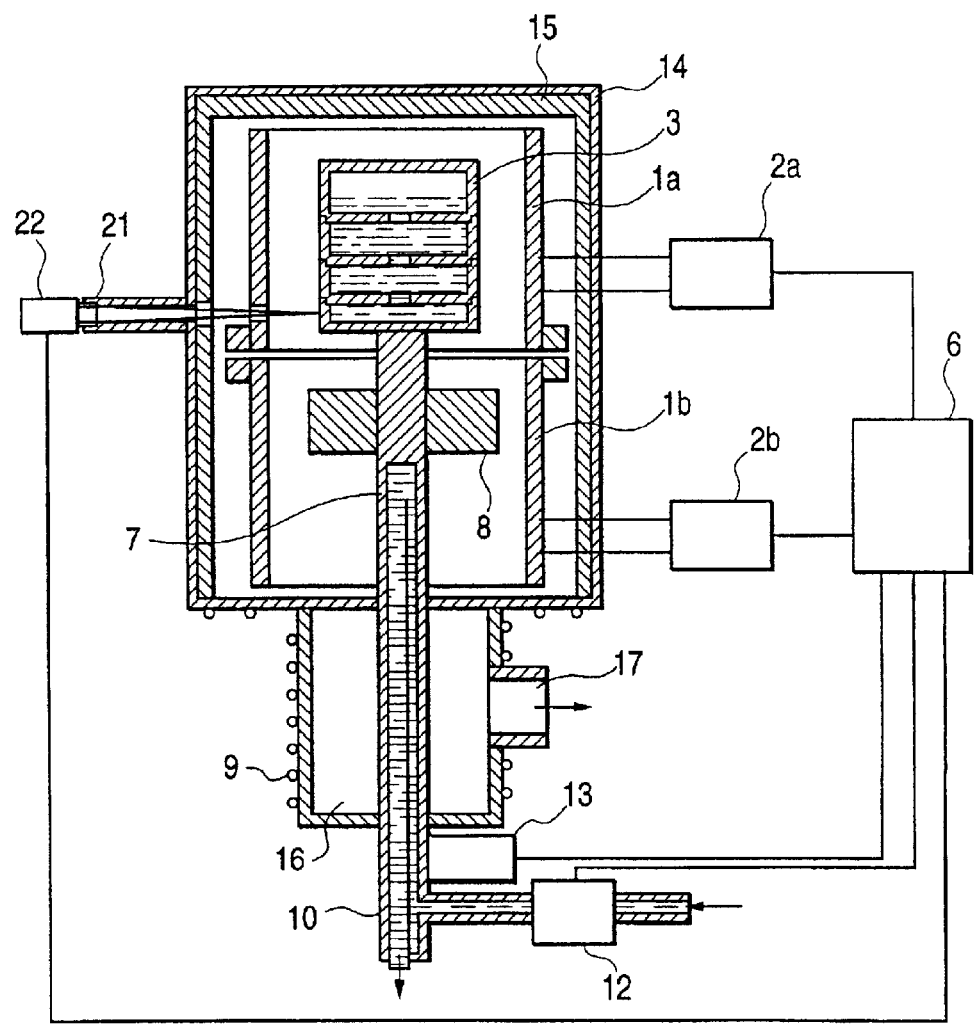
FIG. 18 is a diagrammatic cross-sectional illustration of a crystal growth apparatus according to still another embodiment of the present invention.

FIG. 18 is a diagrammatic cross-sectional illustration of a third embodiment of the apparatus according to the present invention. This embodiment is different from Embodiment 1 in that the temperature of the crucible is measured with a radiation thermometer used in place of the thermocouple, to control the crucible-descending rate (Common constituent members are denoted by like reference numerals).

In the apparatus shown in FIG. 18, a window 21 for a radiation thermometer 22 is provided on the sidewall of the chamber, and the temperature of the crucible 3 is measured with the radiation thermometer 22 through the window 21. The distance between the heater 1a and the window 21 may appropriately be adjusted so that any dust or gas released from carbon or material does not adhere to the window 21. A small hole is made in the insulating material 15 and the heater 1a so that the crucible 3 can be seen directly through the window 21.

Information on the temperature measured with the radiation thermometer 22 is sent to the control unit 6 and is processed in the same manner as in Embodiments 1 and 2 given above, to control the rate of descending the crucible 3.

(Embodiment 4)

Figure 19A:
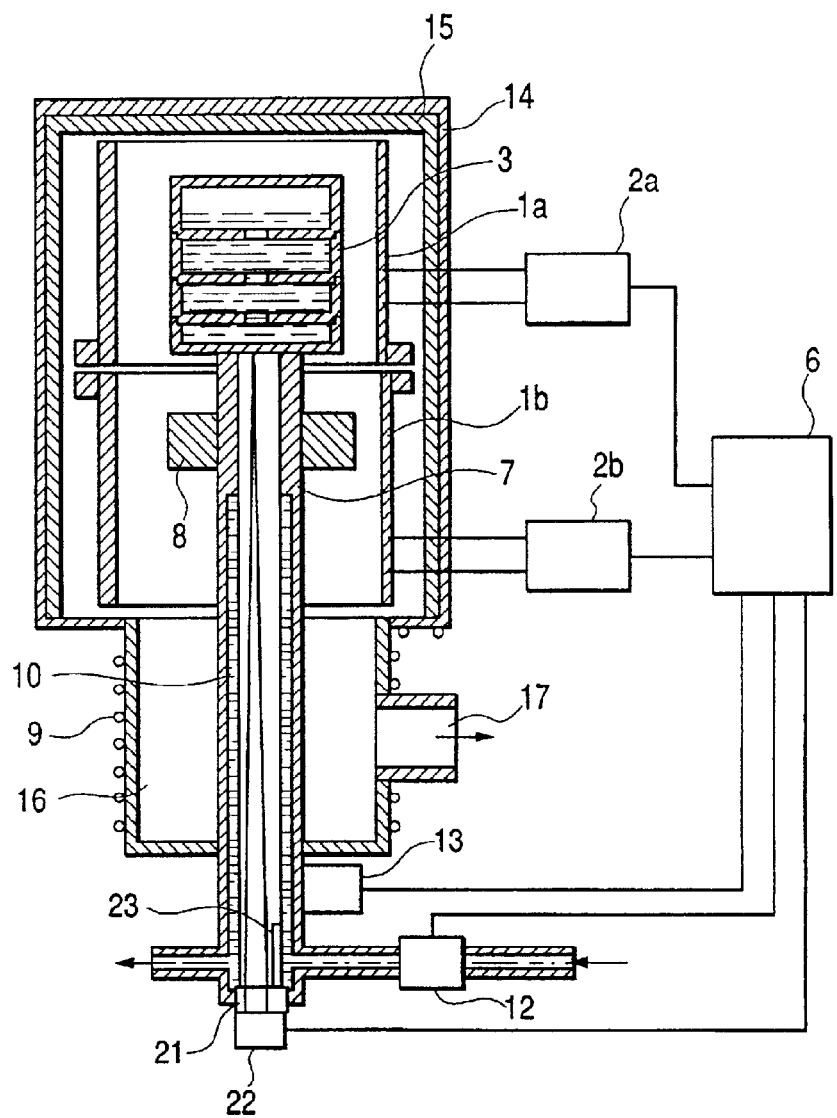
FIG. 19A is a diagrammatic cross-sectional illustration of a crystal growth apparatus according to a further embodiment of the present invention.
Figure 19B:
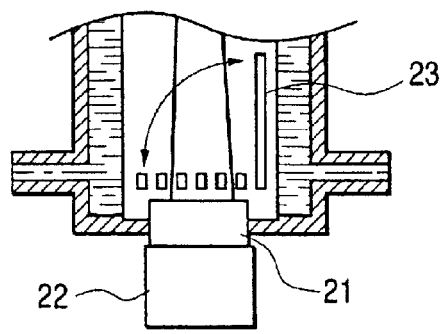
FIG. 19B is a diagrammatic illustration of a structure in which a temperature detector according to the present invention is set in the apparatus shown in FIG. 19A.

FIGS. 19A and 19B are diagrammatic cross-sectional illustrations of a fourth embodiment of the apparatus according to the present invention. This embodiment is different from Embodiment 3 in that the temperature of the crucible at its bottom is measured with a radiation thermometer to control the crucible-descending rate (Common constituent members are denoted by like reference numerals). FIG. 19A is a view showing the whole apparatus, and FIG. 19B a partially enlarged view of the vicinity of the radiation thermometer.

In the apparatus shown in FIGS. 19A and 19B, a window 21 for a radiation thermometer 22 is provided beneath the crucible-supporting rod 7 of the crucible 3 so that the temperature of the crucible 3 at its bottom can be measured. Just in front of the window 21 for the radiation thermometer 22, a shutter 23 is set, and is opened only at the time of measurement to measure the temperature of the crucible 3 at its bottom. Then, the temperature change $\Delta T$ ascribable to latent heat is detected in the same manner as in Embodiments 1 to 3 to control the crystal growth furnace in accordance with the detected temperature information.

(Embodiment 5)

Figure 20:
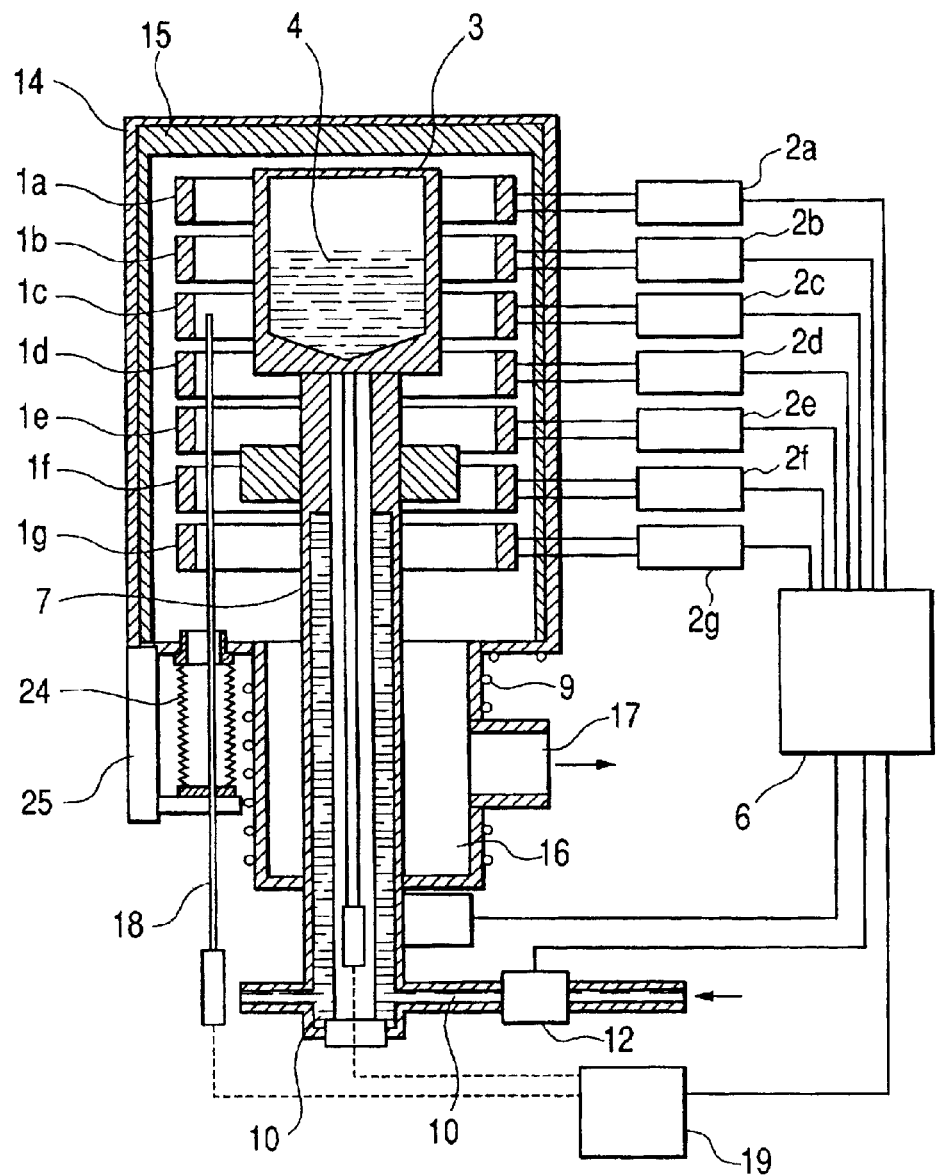
FIG. 20 is a diagrammatic cross-sectional illustration of a crystal growth apparatus according to a still further embodiment of the present invention.

FIG. 20 is a diagrammatic cross-sectional illustration of a fifth embodiment of the apparatus according to the present invention. This apparatus is characterized in that the temperature change $\Delta T$ ascribable to latent heat is measured and the height y(t) of the solid-liquid interface is found from the measured value and Equation (7) to control the crystal growth furnace by changing the temperature of a heater located in the vicinity of the solid-liquid interface (Common constituent members are denoted by like reference numerals).

As described previously in relation to the prior art, the occurrence of the region of supercooling causes deviation of the position of the solid-liquid interface from the position of the melting point. Accordingly, in the apparatus of the present embodiment, the temperature in the vicinity of the solid-liquid interface is measured.

As shown in FIG. 20, the heater 1 is divided into a plurality of heaters 1a to 1g, to which power sources 2a to 2g are set respectively. The power sources 2a to 2g are controlled by the control unit 6. Thus, the growth material 4 held in the crucible 3 can be controlled to have any desired temperature distribution. Also, the thermocouple 18 is inserted to the space between the heater 1 and the crucible 3. A bellows 24 is set to the underside of the vacuum chamber 14, and the thermocouple 18 is extended outside to the atmosphere through a feedthrough on the side opposite to the side on which the bellows 24 is set to the vacuum chamber 14. Also, the feedthrough from which the thermocouple 18 is extended outside is fixed to a thermocouple up-and-down assembly 25 so that the thermocouple 18 is up and down movable with respect to the vacuum chamber.

Where the crystal growth has begun, the temperature change $\Delta T$ ascribable to latent heat is detected, and the results of measurement are sent to the control unit 6, whereupon the height of the solid-liquid interface is found according to Equation (7). The control unit 6 gives instructions to the thermocouple up-and-down assembly 25 so as to move the thermocouple 18 up and down so that the apex which is the temperature measuring point of the thermocouple 18 may come to the position of the solid-liquid interface. When the temperature in the vicinity of the solid-liquid interface, thus measured, is lower than the melting point, there is a high possibility that the region of supercooling has occurred, and hence the descending of the crucible 3 is stopped until the crystal growth proceeds and the solid-liquid interface comes to the position of the temperature corresponding to the melting point. Also, the temperature of a heater (e.g., the heater 1e) may be lowered and temperature gradation in the vicinity of the solid-liquid interface may be made great to prompt the crystal growth to proceed so that the solid-liquid interface can be present at the position of the melting point temperature to make the region of supercooling small.

Alternatively, the input to heaters positioned above and beneath the solid-liquid interface (e.g., the heaters 1d and 1e) may be controlled so that the temperature gradation in the vicinity of the solid-liquid interface may come to an appropriate value, to make the region of supercooling small. In this instance, a plurality of thermocouples may be disposed in the vertical direction as viewed in the drawing. This enables simultaneous measurement of both the temperature at the solid-liquid interface and the temperature gradation, promising a higher efficiency.

In the present embodiment, the thermocouple 18 movable up and down is provided between the crucible 3 and the heater 1 to measure the temperature held at the solid-liquid interface. Alternatively, a plurality of thermocouples (not shown) may be fixed to the sidewall of the crucible 3. In the case where the solid-liquid interface and the apex of the thermocouple are more or less in positional disagreement, it is desirable to make interpolation from a plurality of measured values to find the temperature held at the solid-liquid interface.

In the foregoing description, some examples of the apparatus according to the present invention are given. In all the embodiments, however, as long as the desired temperature distribution can be achieved, the structure of the heater is by no means limited to those shown in the drawings. For example, shown in Embodiment 5 is an example of a heater divided into a plurality of independent heaters, but the heater may be a heater divided into upper and lower two compartments. Alternatively, the lower-part heater may be omitted and the desired temperature distribution may be made by a reflective plate. Also, the reflective plate may be replaced with a cooling cylinder in which cooling water is flowed.

Similarly, the present invention is applicable to all types of crucibles such as the disk type crucible shown in FIG. 19A, a crucible the bottom of which has a structure of a column, a crucible having a conical-columnar structure as shown in FIG. 16, and a crucible having different diameters at its cylindrical body.

As described above, according to Embodiments 1 to 5 of the present invention, the crystal can be produced while measuring the rate of crystal growth. Hence, an apparatus for producing a crystal article and a process for producing a crystal article can be provided which can control the crystal growth furnace so that the crucible-descending rate is in agreement with the crystal growth rate. In particular, according to the apparatus and process of the present invention, the crystal growth furnace can be so controlled as to make the region of supercooling small, and hence the stray crystals can be prevented from occurring, making it possible to produce a large-area and good-quality crystal stably. Also, for that reason, temperature changes can be detected from growth material temperature detected by means of the thermocouple, the radiation thermometer or a Peltier device, and the generation of latent heat can be detected from the temperature changes.

(Embodiment 6)

Figure 21:
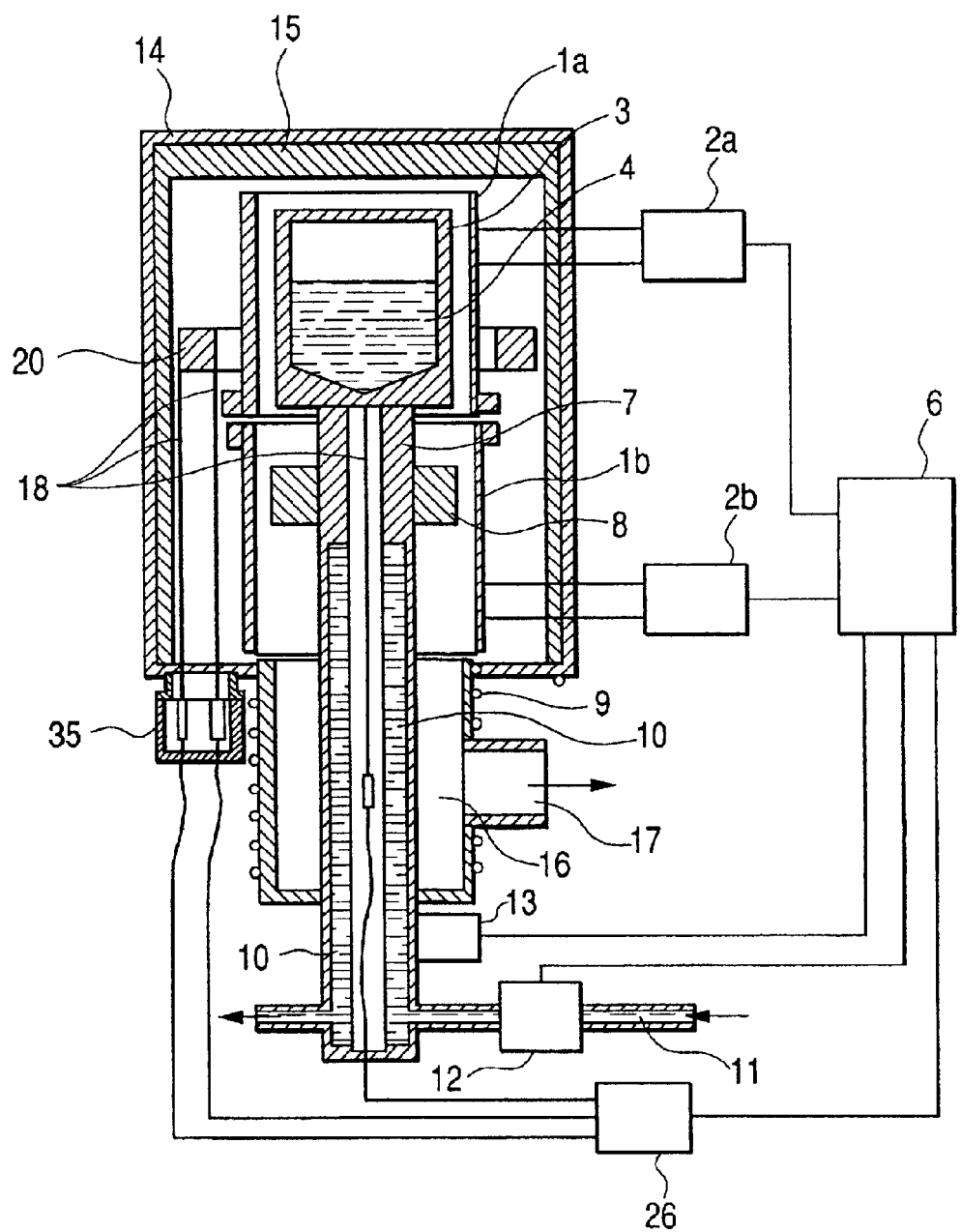
FIG. 21 is a diagrammatic cross-sectional illustration of a crystal growth apparatus according to a still further embodiment of the present invention.

An apparatus for producing a crystal article according to the present Embodiment is shown in FIG. 21. This apparatus has basically the same structure as the apparatus shown in FIG. 16. The same constituent members as those in FIG. 16 are denoted by like reference numerals.

The present apparatus is different from the apparatus shown in FIG. 16 in that a ring-shaped cylindrical member 20 (cylinder 20 for temperature measurement) is provided along the periphery of, and away from, the heater 1a and that temperature detectors 18 such as thermocouples are additionally set to the cylindrical member 20 on both the innermost side and the outermost side thereof with respect to the sidewall of the heater 1a.

The heat generated at the heater 1a warms up the cylinder 20 for temperature measurement, and then the heat is dissipated to the atmosphere from the outer side of the cylinder 20 through the insulating material 15 and vacuum chamber 14. Accordingly, the heat flow rate can be measured by means of the thermocouples 18 set on the innermost side and outermost side of the cylinder 20 for temperature measurement.

Electric power is supplied to the heaters 1a and 1b, and the crucible 3 is heated, which is kept as it is until the growth material held therein such as $CaF_2$ has melted sufficiently. It takes few hours to few days after the power of the heaters has been made constant, until the growth material melts sufficiently and becomes stable. During this melting, the temperature of the crucible 3 at its bottom is measured with the thermocouple 18 set to the underside of the crucible 3. The data of temperature measured are sent through a measuring instrument 26 to the control unit 6, where the temperature of the crucible 3 is recorded. Whether or not the growth material has melted sufficiently and has become stable can be judged from whether or not the temperature of the crucible 3 has become constant.

If the temperature of the crucible 3 at its center does not stand lowest, i.e., if the isothermal curve in the crucible 3 does not stand upward convex, the control unit 6 gives instructions to the power source 2a of the heater 1a so as to increase its electric power and at the same time gives instructions to the flow rate control valve 12 in order to increase the cooling capacity of the crucible-supporting rod 7.

In order to make the growth material solidify while keeping the temperature distribution having an upward convex isothermal curve, the control unit 6 gives instructions to the up-and-down mechanism 13 so as to descend the crucible 3. Here, the crucible may be descended at a rate of from 0.1 mm/hour to 10 mm/hour. Since, however, the crucible becomes cool more slowly at the center than its outskirts, a too high crucible-descending rate makes the growth material at the center unable to catch up with the lowering of temperature, making it impossible to keep the isothermal curve in the crucible 3 upward convex. In such a case, the crucible-descending rate is made small.

Where the crystal growth has begun, a temperature change occurs in the heat flow rate as is shown by the time t1 in FIG. 8. There is a possibility that the supercooling has occurred if the crystal growth does not begin even though the temperature has reached the melting point. Accordingly, the crucible-descending rate must be made small to make the region of supercooling small. Also, the flow rate of the cooling water inside the crucible-supporting rod 7 may be so controlled as to increase to prompt the crystal growth to begin. The above operation may be made after the crystal growth has taken place and the isothermal curve has become unable to be kept upward convex because of latent heat and so forth. Thus, the isothermal curve can always be kept upward convex.

Next, after the crystal growth has come in a state of the time t2 shown in FIG. 8, the rate of crystal growth is kept constant. In accordance with the information sent through the measuring instrument 26 to the control unit 6 on the temperature measured with the two thermocouples 18 set to the innermost side and outermost side of the cylinder 20 for temperature measurement, the crystal growth rate (dh/dt) is determined. When the crystal growth rate has become lower than the crucible-descending rate, the control unit 6 gives instructions to the up-and-down mechanism 13 so as to lower the crucible-descending rate so that the crucible-descending rate comes into agreement with the crystal growth rate.

In this way, after the crystal growth has come in a state of the time t4, the crystal growth is completed. Here, the crystal growth rate (dh/dt) has changed at the time t3, but this is an end point of the crystal and hence the control is made so that the crucible-descending rate does not become low at the time t3. The time at which the crystal growth rate has become small is judged as the end point of the crystal as long as the distance at which the crucible has descended from the position of the time t1 is equal to the length of the crucible in the vertical direction.

The thermocouple may also optionally be provided on the sidewall of the crucible 3 or at the bottom of the crucible 3 in order to keep highly precise the temperature distribution where the isothermal curve is slightly upward convex.

(Embodiment 7)

Figure 22:
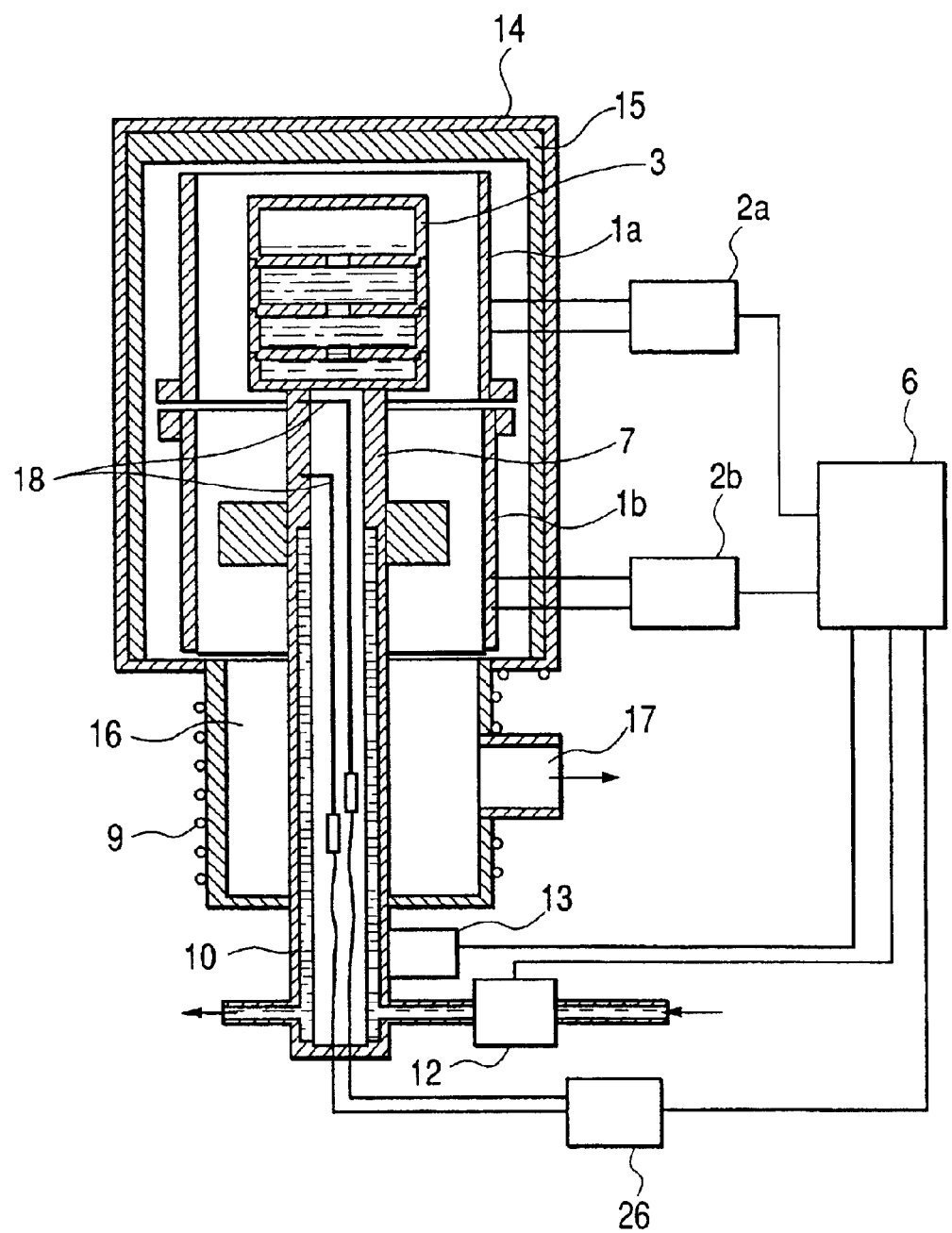
FIG. 22 is a diagrammatic cross-sectional illustration of a crystal growth apparatus according to a still further embodiment of the present invention.

FIG. 22 shows an apparatus in which a heat flow rate at which the heat of the crucible is dissipated outside through the crucible-supporting rod of the crucible is measured. The crucible-supporting rod 7 is made to have a high temperature gradation at its upper part and a low temperature gradation at its lower part. Accordingly, thermocouples 18 are provided away from each other in its vertical direction in the crucible-supporting rod 7.

In this appratus, too, the heat flow rate ascribable to latent heat is detected, and the crystal growth furnace is controlled in accordance with the detected information.

Stated specifically, where the heat flow rate ascribable to latent heat has been detected, the crucible-descending rate may be changed so that it becomes low at the time t1, or the crucible may be cooled locally at its bottom center, or the crucible may be vibrated.

(Embodiment 8)

Figure 23:
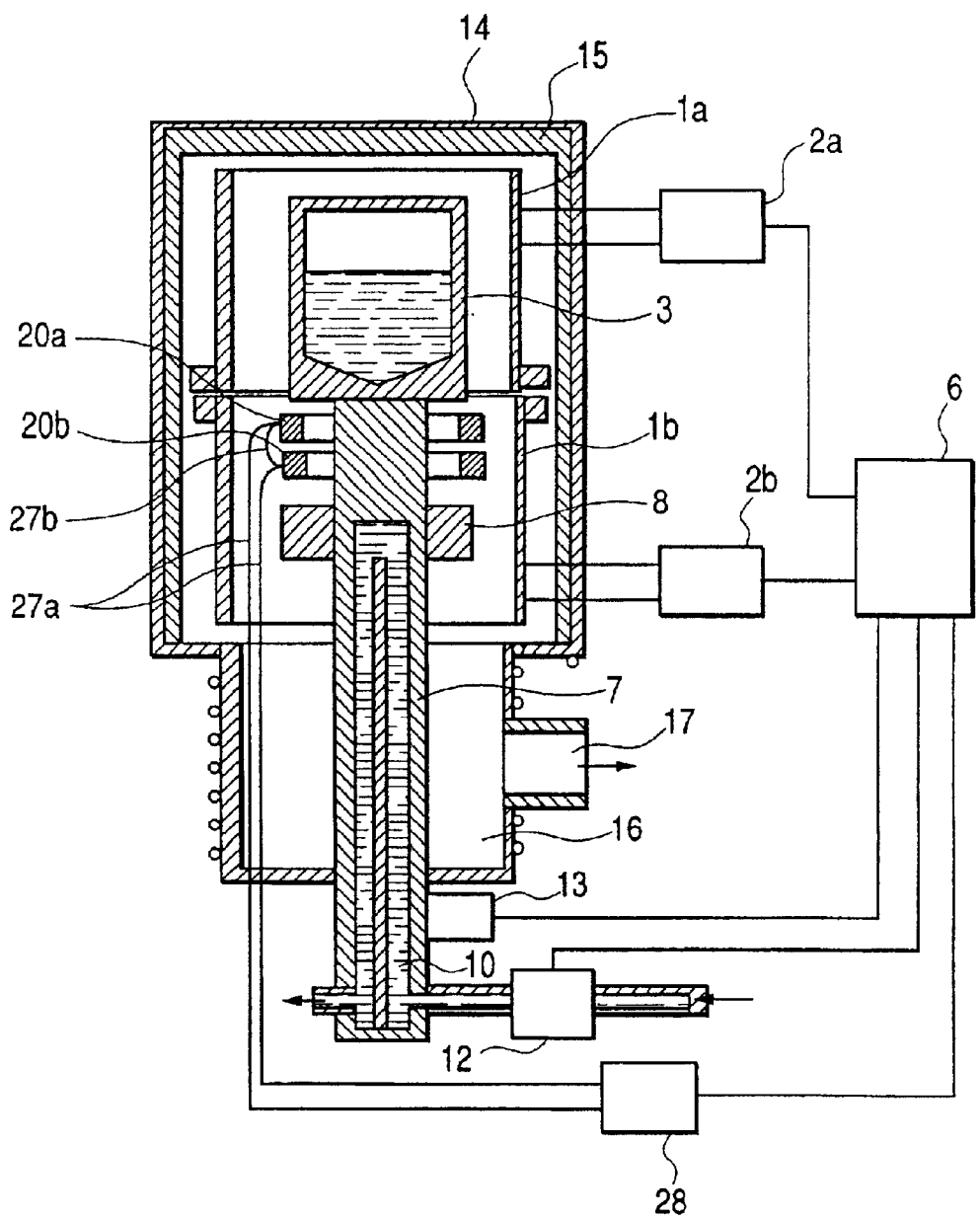
FIG. 23 is a diagrammatic cross-sectional illustration of a crystal growth apparatus according to a still further embodiment of the present invention.

FIG. 23 shows an apparatus for producing a crystal article according to the present Embodiment. This apparatus has basically the same structure as those in the embodiments given above. Common constituent members are denoted by like reference numerals.

This apparatus is characterized in the following.

In this apparatus, ring-shaped upper and lower cylinders 20a and 20b for temperature measurement are provided around the crucible-supporting rod 7 so that the temperature difference between the cylinders can be measured. The cylinders 20a and 20b for temperature measurement are connected through a metal wire 27b, and metal wires 27a are connected to both the cylinders 20a and 20b for temperature measurement and their opposite ends are connected to a voltmeter 28. As well known, the metal wires 27a and 27b are made of different materials and a thermal electromotive force is produced at the both ends of the metal wires 27a when the cylinders 20a and 20b for temperature measurement have different temperatures. This thermal electromotive force corresponds to the temperature difference between the cylinders 20a and 20b for temperature measurement, and hence the thermal electromotive force may be measured with the voltmeter 28 to find the temperature difference immediately and to find the heat flow rate.

Thus, this apparatus operates as described below.

Where the heat flow rate ascribable to latent heat has been detected in the course of descending the crucible 3 at a constant rate, the crystal growth rate is found from the information of heat flow rate, and the crucible-descending rate is once lowered so that the crystal growth rate comes into agreement with the crucible-descending rate. Thereafter, the crucible is descended so that its descending rate becomes equal to the crystal growth rate obtained.

In Embodiments 6 to 8 described above, the thermocouple is used as a temperature detector. Without limitation thereto, a radiation thermometer or resistance thermometer may also be used.

In this way, the generation of latent heat can be detected by a detecting means comprising the temperature detector 18, its metal wires 27a and 27b, the measuring instrument 26, the voltmeter 28 and also the control unit.

In all the embodiments, as long as the desired temperature distribution can be achieved, the structure of the heater is by no means limited. For example, shown in the foregoing is an example of a heater divided into a plurality of independent heaters, but the lower-part heater may be replaced with a reflective plate to make the desired temperature distribution. Also, the reflective plate may be replaced with a cooling cylinder in which cooling water is flowed.

Similarly, the present invention is applicable to all types of crucibles such as the disk type crucible, a crucible the bottom of which has a structure of a column, a crucible having a conical-columnar structure, and a crucible having different diameters at its cylindrical body.

(Embodiment 9)

Figure 24A:
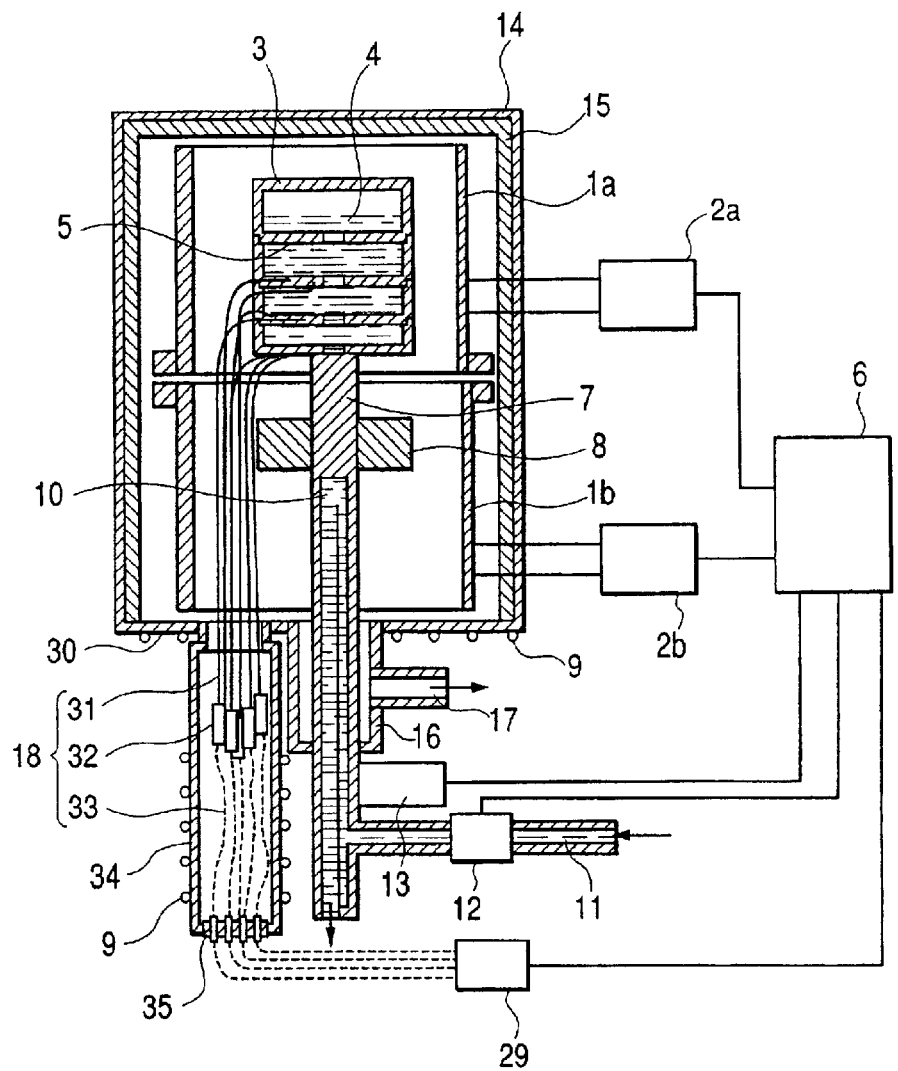
FIG. 24A is a diagrammatic cross-sectional illustration of a crystal growth apparatus according to a still further embodiment of the present invention.

FIG. 24A is a diagrammatic cross-sectional illustration of a further embodiment of the apparatus according to the present invention. It shows an example in which the present invention is applied to an apparatus having a furnace the inside of which is divided into a high-temperature first region (high-temperature region) and a low-temperature second region (low-temperature region), which are each temperature-controlled by a heater independently provided.

In FIG. 24A, reference numerals 1a and 1b denote a first heater and a second heater, respectively; 2a and 2b, power sources for the first heater and second heater, respectively; 3, a crucible; 4, a growth material put into the crucible; 5, a disk (in plurality); 6, a control unit; 7, a crucible-supporting rod; 8, a heat-insulating material provided beneath the crucible; 9, piping for a refrigerant; 10, a flow path for the refrigerant; 11, a refrigerant inlet; 12, a flow rate control valve; 13, an up-and-down mechanism for descending the crucible via the crucible-supporting rod 7; 18, a thermocouple (provided in plurality); 31, a sheathed portion of the thermocouple; 32, a connecting part of the thermocouple; 33, lead wires of the thermocouple; 29, a temperature measuring instrument connected to the thermocouple; 34, a thermocouple casing; 35, a feedthrough from which the lead wires of each thermocouple is extended outside; 14, a vacuum chamber; 15, a heat-insulating material; 16, an exhaust chamber; 17, an exhaust vent; and 30, a base plate.

The inside of the vacuum chamber 14, made of a metal such as stainless steel, is evacuated from the exhaust vent 17 through the exhaust chamber 16, and the pressure in the vacuum chamber is kept at $1.33 \times 10^{-3}$ Pa to $1.33 \times 10^{-4}$ Pa. The heat-insulating material 15 is attached to the inner wall of the vacuum chamber 14 and has a structure that does not allow the heat generated by the heaters 1a and 1b to escape. The heaters 1a and 1b are formed of a carbon material or the like, and are electrified through the power sources 2a and 2b, respectively, to generate heat. Then, the heat thus generated is supplied by radiation to the crucible 3 placed inside the heaters 1a and 1b. The crucible 3 is made of a substance such as carbon, which does not react with the growth material 4 of a crystal. The growth material 4 of a crystal, such as calcium fluoride, is held in the crucible 3. Also, the crucible-supporting rod 7 for supporting the crucible is set beneath the crucible. The crucible-supporting rod 7 is set to the up-and-down mechanism 13, and the up-and-down mechanism 13 is driven in accordance with instructions given from the control unit 6, thus the crucible 3 is up and down moved.

As a temperature control mechanism different from the heating elements heaters 1a and 1b, the refrigerant flow path 10 is provided inside the crucible-supporting rod 7. The refrigerant flowed in from the refrigerant inlet 11 flows into the flow path 10 through the control valve 12, takes the heat away from the crucible-supporting rod 7 while passing through the inside of the crucible-supporting rod 7, and is discharged from a discharge outlet. The cooling capacity attributable to the refrigerant commonly depends on the temperature and flow rate of the refrigerant. In the present example, the cooling capacity is determined by the flow rate by controlling the flow rate control valve 12 with the control unit 6. Accordingly, when the temperature of the crucible at its center is too high, the cooling capacity is made higher by opening the flow rate control valve 12, whereby the temperature of the crucible at its center can be lowered.

Figure 24B:
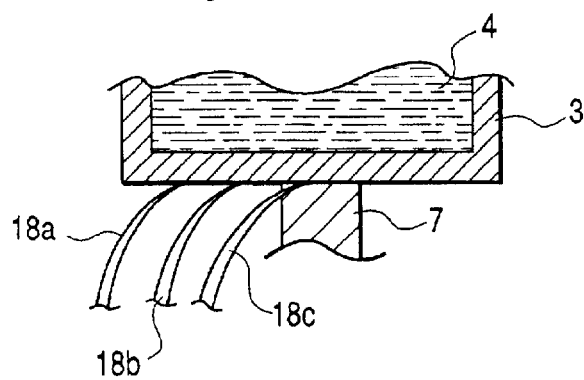
FIG. 24B is a diagrammatic illustration of a structure in which a temperature detector according to the present invention is set in the apparatus shown in FIG. 24A.

Each thermocouple 18 is constituted of the sheathed portion 31, the lead wire 33 and the connecting part 32 at which the sheathed portion 31 and the lead wire 33 are connected. The sheathed portion 31 serves as a temperature sensor at its tip, and is appropriately set at a place where the temperature must be measured. In particular, in the present example, in order to measure in-plane temperature distribution in the crucible 3, a plurality of thermocouples are set to the underside of the crucible 3 at its radius direction as shown in FIG. 24B. Also, not only at the underside of the crucible 3, a hole is made in the disk 5 and a plurality of thermocouples are set thereto so that the temperature distribution can be measured. At least three thermocouples are set to the disk 5 on its plane intersecting the direction of crystal growth. A thermocouple may also optionally be set on the sidewall of the crucible.

The piping 9 for a refrigerant is also set to the base plate 30 so that the base plate 30 can be held at a desired constant temperature also in a state where electric power is applied to the heater. The length of the sheathed portion 31 is so determined that the sheathed portion is positioned beneath the base plate 30 and inside the thermocouple casing 34. The thermocouple casing 34 is set to the base plate 30 held at a constant temperature and at the same time has a structure that the piping 9 for a refrigerant is set to the outer sidewall so as to keep the temperature from rising. Hence, the lead wires 33 having lower corrosion resistance and heat resistance than the sheathed portion can be kept from being exposed to corrosive gases or high-temperature heat and can withstand the measurement. Here, the thermocouple casing 34 is set up in such a size that each connecting part 32 does not strike the feedthrough 35 when the crucible 3 is descended completely.

Each thermocouple 18 is extended outside from the vacuum chamber 14 at its sheathed portion 31 but once into the thermocouple casing 34, and its lead wire3 33 are further extended outside from the thermocouple casing 34 through the feedthrough 35. The feedthrough 35 shown in FIG. 24A is, as shown in FIG. 15, constituted of at least one feedthrough cylinder 42 through which lead wires 33 are passed, a feedthrough frame 43, and O-rings 44 fitted to the feedthrough cylinder 42 and feedthrough frame 43. The feedthrough cylinder 42 is made of an insulating material, and two holes through which the lead wires 33 are passed are made therein in its axial direction. These holes are fixedly closed with an insulating adhesive after the lead wires have been passed therethrough, to provide a vacuum-sealed structure. Hence, the inside of the vacuum chamber 14, inclusive of the thermocouple casing, can be kept vacuum and also any temperature difference produced between the inside and outside of the vacuum chamber 14 and thermocouple casing 34 does not cause errors in temperature measurement. Then, the lead wires 33 extended outside from thermocouple casing 34 through the feedthrough 35 are connected to the temperature measuring instrument 29, and the information obtained is sent to the control unit 6.

Water may be used as the refrigerant to be flowed in the flow path inside the crucible-supporting rod 7. Since, however, the water has a boiling point of 100° C., a cooling oil or the like may be used when it is intended to control temperatures higher than 100° C.

How the apparatus constituted as described above operates will be described below.

First, electric power is supplied to the heaters 1a and 1b, and the crucible 3 is heated, which is kept as it is until the growth material held therein has melted sufficiently. In the case where the growth material 4 is, e.g., $CaF_2$, it takes few hours to few days after the power of the heaters 1a and 1b has been made constant, until the growth material melts sufficiently and becomes stable. During this melting, the temperature of the crucible 3 at its bottom is measured with the thermocouple 18 set to the underside of the crucible 3. The data of temperature measured are sent through the measuring instrument 29 to the control unit 6, where the temperature of the crucible 3 is recorded. As to whether or not the growth material has melted sufficiently and has become stable, the molten growth material is considered to have become stable when the temperature of the crucible 3 is kept constant.

If the temperature of the crucible 3 at its center does not stand lowest, i.e., if the isothermal curve in the crucible 3 does not stand upward convex, the control unit 6 gives instructions to the power source 2a of the heater so as to increase the electric power and at the same time gives instructions to the flow rate control valve 12 in order to increase the cooling capacity of the crucible-supporting rod 7.

In order to make the growth material solidify while keeping the temperature distribution having an upward convex isothermal curve, the control unit 6 gives instructions to the up-and-down mechanism 13 so as to descend the crucible 3, in the time that the temperature of the crucible 3 at its underside or the in-plane temperature of the disk 5 is always measured. Here, the crucible may be descended at a rate of from 0.1 mm/hour to 10 mm/hour. Since, however, the crucible becomes cool more slowly at the center than its outskirts, a too high crucible-descending rate makes the growth material at the center unable to catch up with the lowering of temperature, making it impossible to keep the isothermal curve in the crucible 3 upward convex. In such a case, the crucible-descending rate is made small.

Figure 25:
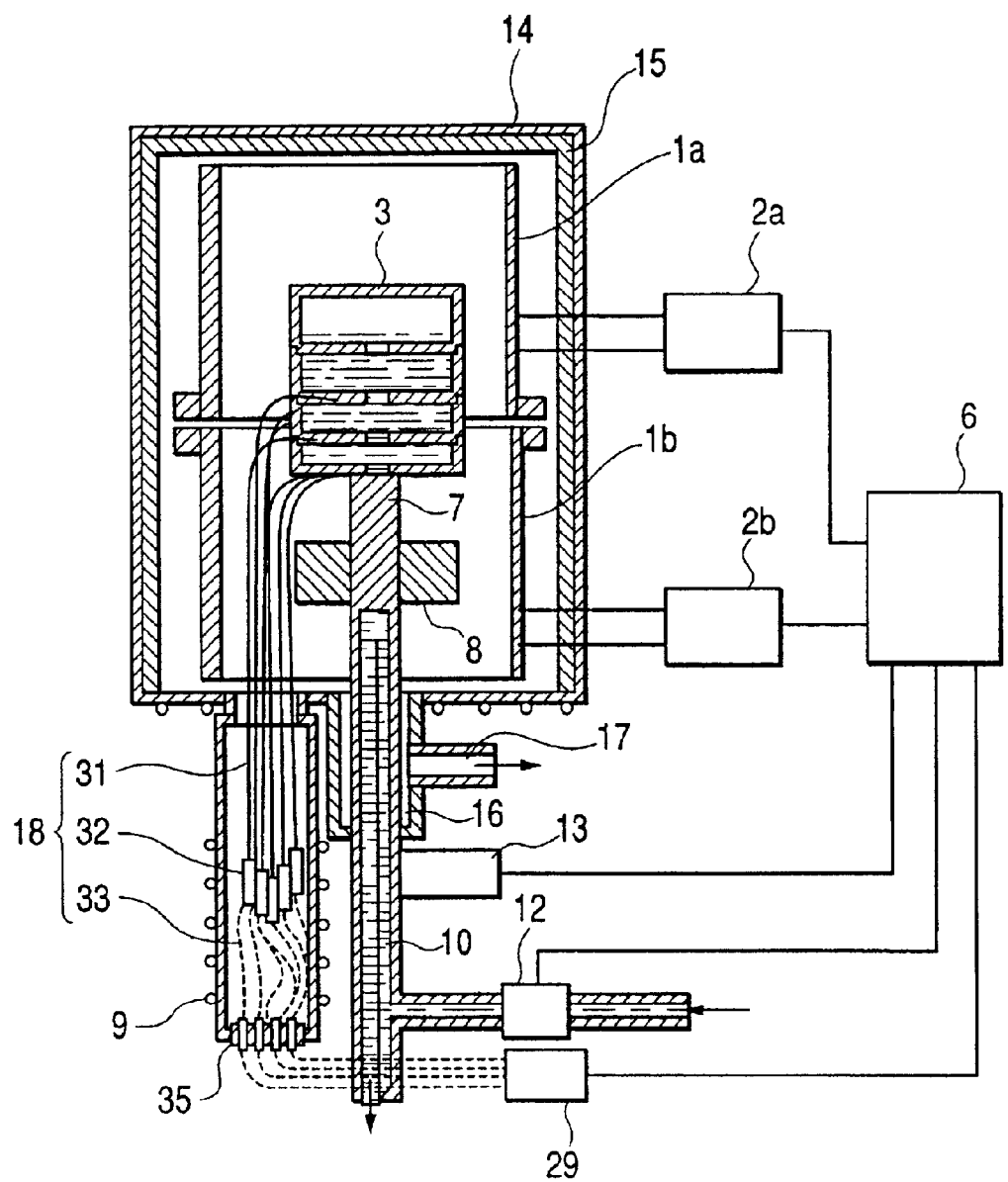
FIG. 25 is a diagrammatic cross-sectional illustration of a crystal growth apparatus according to a still further embodiment of the present invention.

When the crucible 3 is descended, the lead wires 33 having a flexibility are bent as shown in FIG. 25, so that the lead wires 33 become loose to absorb the distance at which the crucible has descended. Hence, any unnecessary force is by no means applied to the sheathed portion 31 of the thermocouple 18, thus the thermocouple 18 does not break or the thermocouple 18 does not hinder the crucible 3 from being descended.

Where the crystal growth has begun, a temperature change occurs in the temperature of the crucible 3 as is shown by the time t1 in FIG. 5A. There is a possibility that the supercooling has occurred if the crystal growth does not begin even though the temperature has reached the melting point. Accordingly, the crucible-descending rate must be made small to make the region of supercooling small. Here, the above operation may be made after the isothermal curve has become unable to be kept upward convex because of latent heat and so forth. Thus, the isothermal curve can always be kept upward convex.

Next, after the crystal growth has come in a state of the time t2 shown in FIG. 5A, the crystal growth has taken place on the whole bottom of the crucible 3. Accordingly, the flow rate of the cooling water and the crucible-descending rate are controlled so as to flatten the isothermal curve. Even in such a case, too, the temperature around the crucible 3 is kept a little low in order to prevent the crystal growth from proceeding toward the center of the crucible 3. In this way, after the crystal growth has come in a state of the time t4, the crystal growth is completed on the first disk.

The crucible 3 is further descended, whereupon the crystal growth begins on the second disk. Accordingly, the temperature distribution having an upward convex isothermal curve is maintained until the crystal growth begins on the whole bottom of the crucible. Thereafter, the procedure on the first disk is repeated, e.g., to make the temperature distribution flat.

In the present embodiment, described is an example in which the present invention is applied to the crucible called the disk type crucible. Needless to say, the present invention is also applicable to a crucible having no disks or a crucible having a conical bottom shape.

(Embodiment 10)

Figure 26:
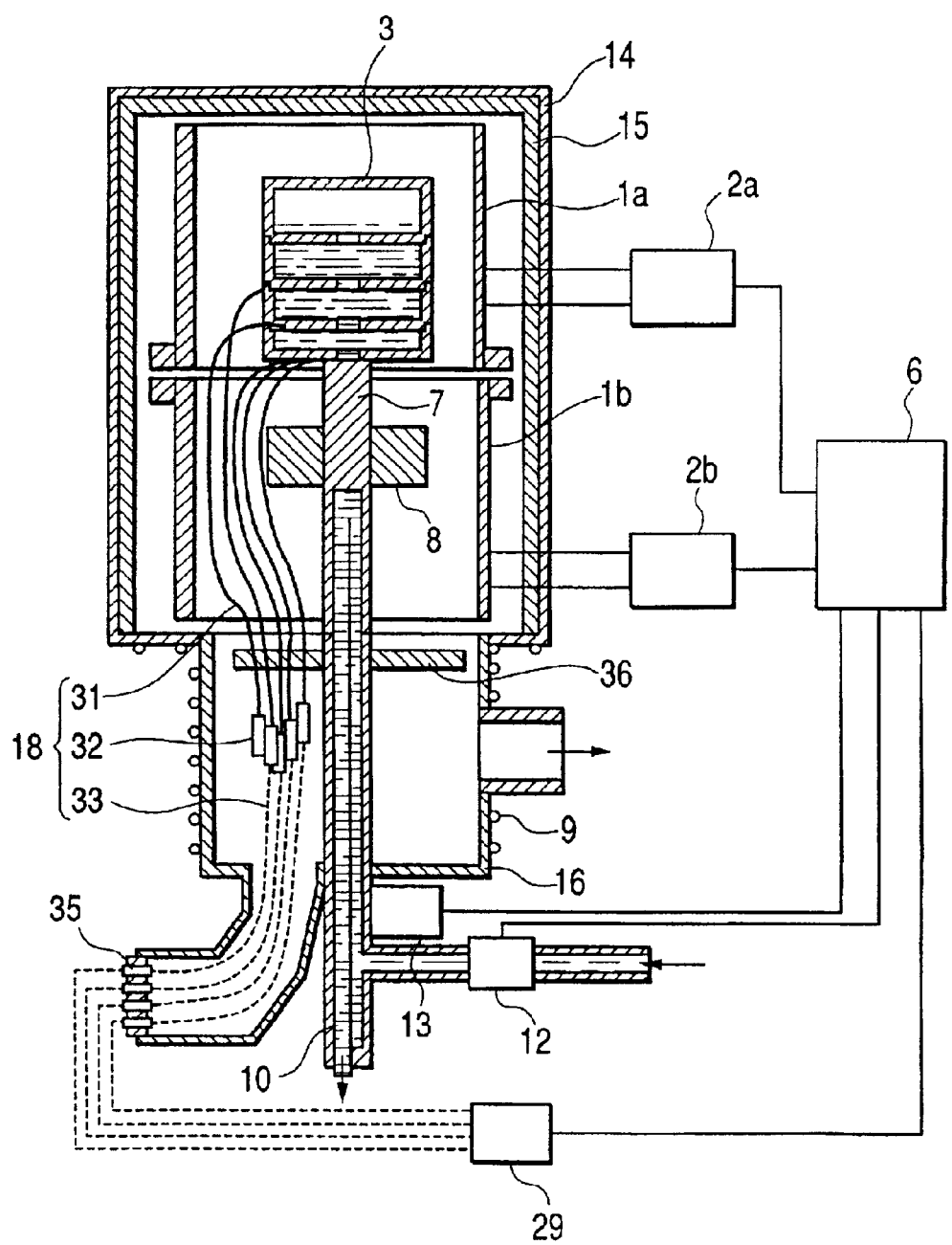
FIG. 26 is a diagrammatic cross-sectional illustration of a crystal growth apparatus according to a still further embodiment of the present invention.

FIG. 26 is a diagrammatic cross-sectional illustration of an apparatus according to Embodiment 10 of the present invention. This apparatus has construction different from Embodiment 9 in that the exhaust chamber 16 also serves as a thermocouple casing.

In the appratus shown in FIG. 26, the feedthrough 35 for extending the thermocouple outside is set to the lower part of the exhaust chamber 16. Each thermocouple 18 is extended outside from the vacuum chamber 14 at its sheathed potion 31 into the exhaust chamber 16, and its lead wires 33 are further extended outside through the feedthrough 35 from the exhaust chamber 16 serving also as the thermocouple casing. Also, the cooling piping 9 is provided on the periphery of the exhaust chamber 16 so that its temperature does not rise. Thus, the temperature of the connecting part 32 and lead wires 33 does not rise and, when the crucible 3 is descended, the lead wires 33 become loose to absorb the distance at which the crucible has descended.

However, even though the exhaust chamber 16 is held at a low temperature, the connecting part 32 and lead wires 33 of the thermocouple may come to have a temperature higher than some tolerance temperature by the action of radiation from the insulating material 8 provided beneath the crucible 3 in the lower part heater 1b. Accordingly, a shielding plate 36 is set to the crucible-supporting rod 7 at its position higher than the connecting part 32. Since such a shielding plate 36 is provided, the connecting part 32 and lead wires 33 by no means come to have the temperature higher than the tolerance temperature. Cooling water may be circulated through the inside of the shielding plate 36.

In FIG. 26, what is shown is an apparatus in which the shielding plate 36 is set to the crucible-supporting rod 7. Alternatively, the shielding plate 36 may be set to the sheathed portion 31 located just above the connecting part 32 of the thermocouple. Such a shielding plate 36 may be those having a small emissivity, as being highly effective. A metal plate or foil made of aluminum or stainless steel is preferred.

The inside of the exhaust chamber 16 is also fairly contaminated with carbon dust or the like during the crystal growth. Hence, there is a possibility that carbon films adhere to the O-ring 44 vacuum-sealing the feedthrough cylinder 42 to tend to make the vacuum break or that a short circuit of the lead wires occur on the feedthrough surface. In the present embodiment, in order to prevent this, the feedthrough 35 is so disposed that its surface on the side of the exhaust chamber 16 (i.e., on the side of the vacuum chamber 14) to which surface the feedthrough cylinder 42 is set flat-top is in the gravity direction (i.e., vertical direction) or is inclined toward the horizontal direction from the vertical direction.

(Embodiment 11)

Figure 27:
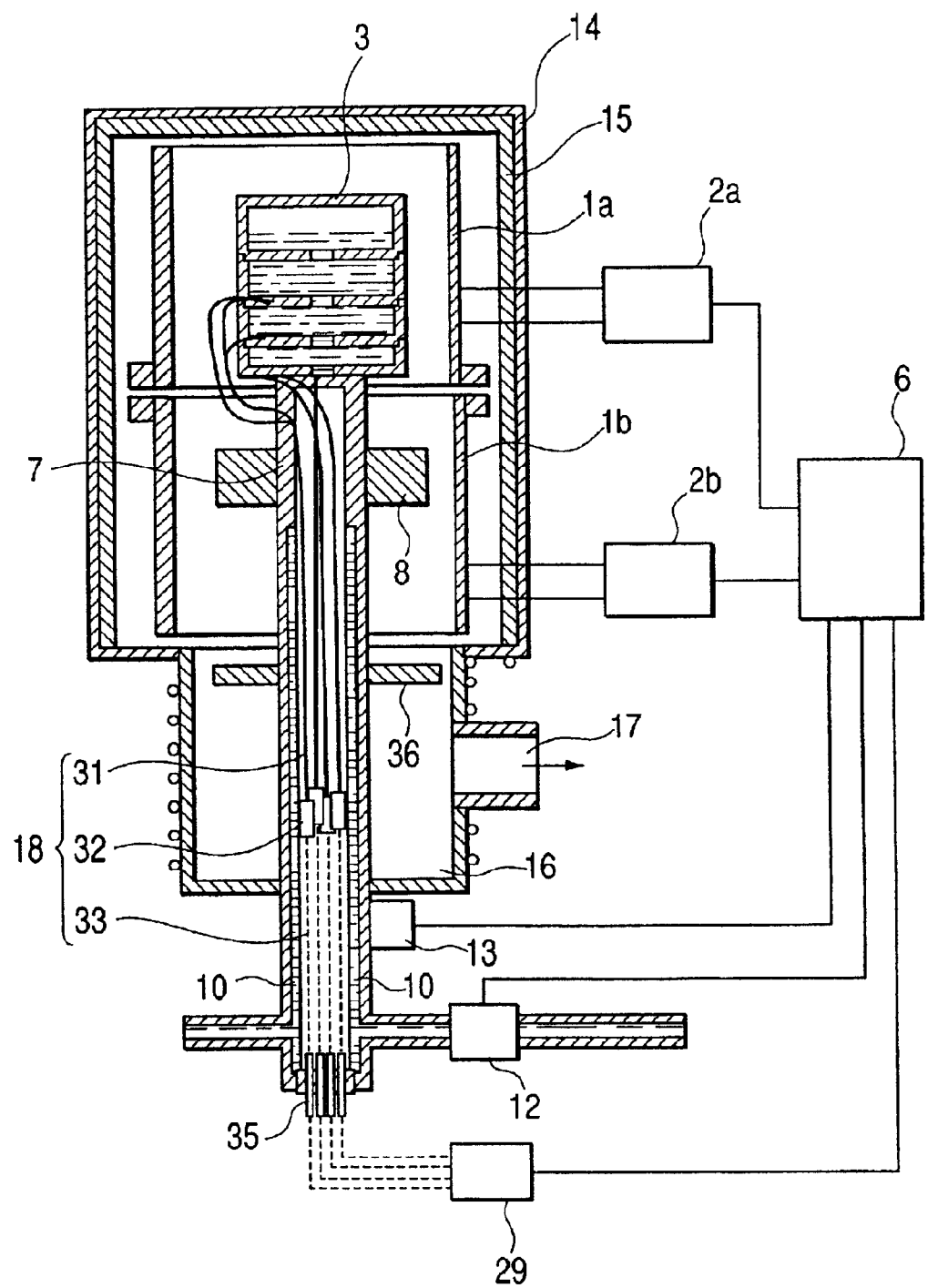
FIG. 27 is a diagrammatic cross-sectional illustration of a crystal growth apparatus according to a still further embodiment of the present invention.

FIG. 27 is a diagrammatic cross-sectional illustration of an apparatus according to Embodiment 11 of the present invention. This apparatus has construction different from Embodiment 9 in that the thermocouple 18 is passed through the inside of the crucible-supporting rod 7.

In the appratus shown in FIG. 27, the feedthrough 35 for extending the thermocouple outside is set to the lower part of the exhaust chamber 16, and the lead wires 33 are extended outside from the vacuum region. Also, the length of the thermocouple 18 is so adjusted that the sheathed portion 31 and lead wires 33 may stand at the position of a low-temperature portion of the crucible-supporting rod 7. Such construction is effective especially when the crucible 3 is rotated.

(Embodiment 12)

Figure 28:
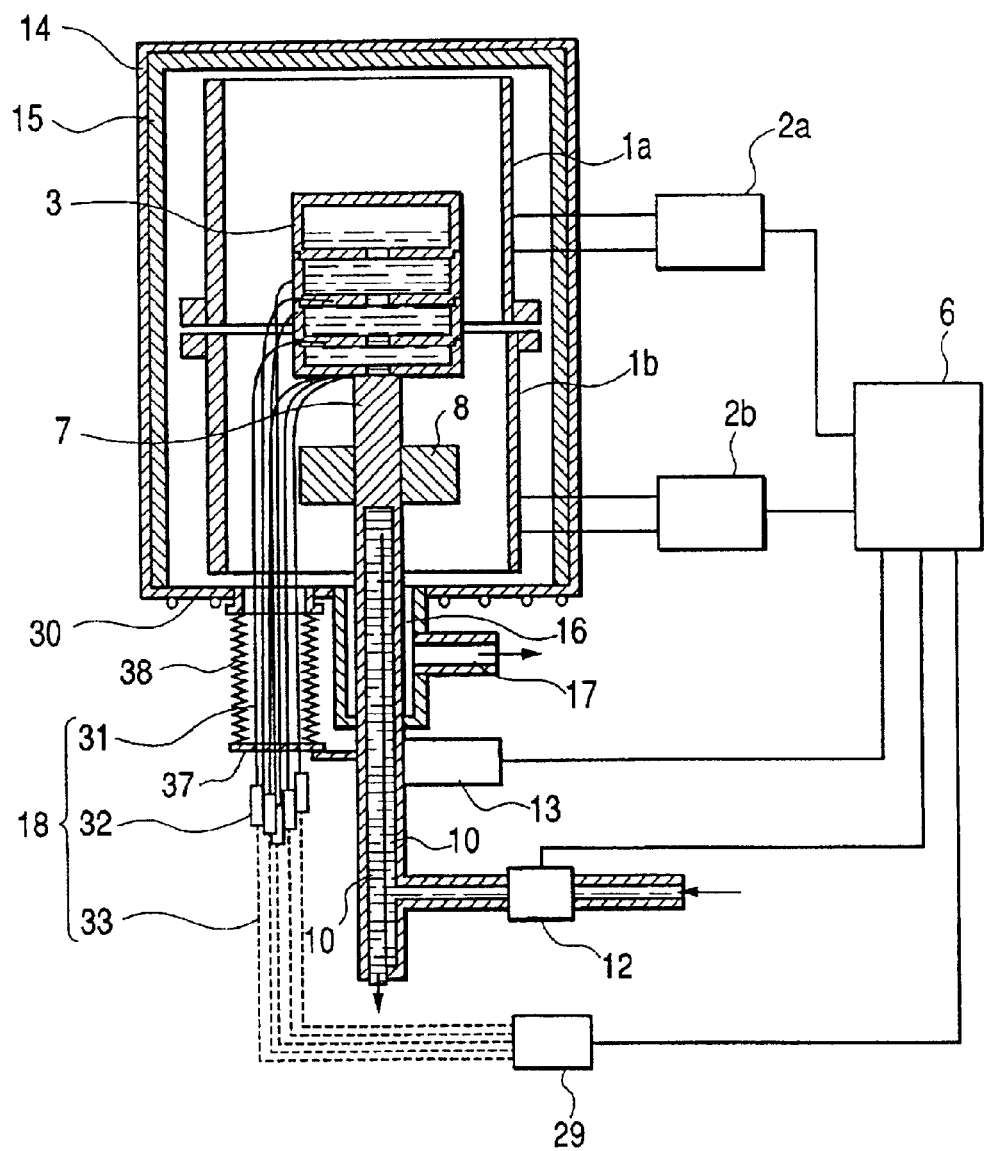
FIG. 28 is a diagrammatic cross-sectional illustration of a crystal growth apparatus according to a still further embodiment of the present invention.

FIG. 28 is a diagrammatic cross-sectional illustration of an apparatus according to Embodiment 12 of the present invention. This apparatus has construction different from Embodiment 9 in that a feedthrough 37 for extending outside from the vacuum chamber 14 the thermocouple 18 set to the crucible 3 is movable with the movement of the crucible 3.

In the appratus shown in FIG. 28, the feedthrough 37 is provided via a bellows 38 extending between the base plate 30 and the feedthrough 37 and also the feedthrough is fixed to the crucible-supporting rod 7. Where the crucible 3 is descended under such construction, as shown in FIG. 29 the bellows 38 elongates so that the thermocouple 18 does not become loose correspondingly to the amount of the movement of the crucible 3.

Figure 29:
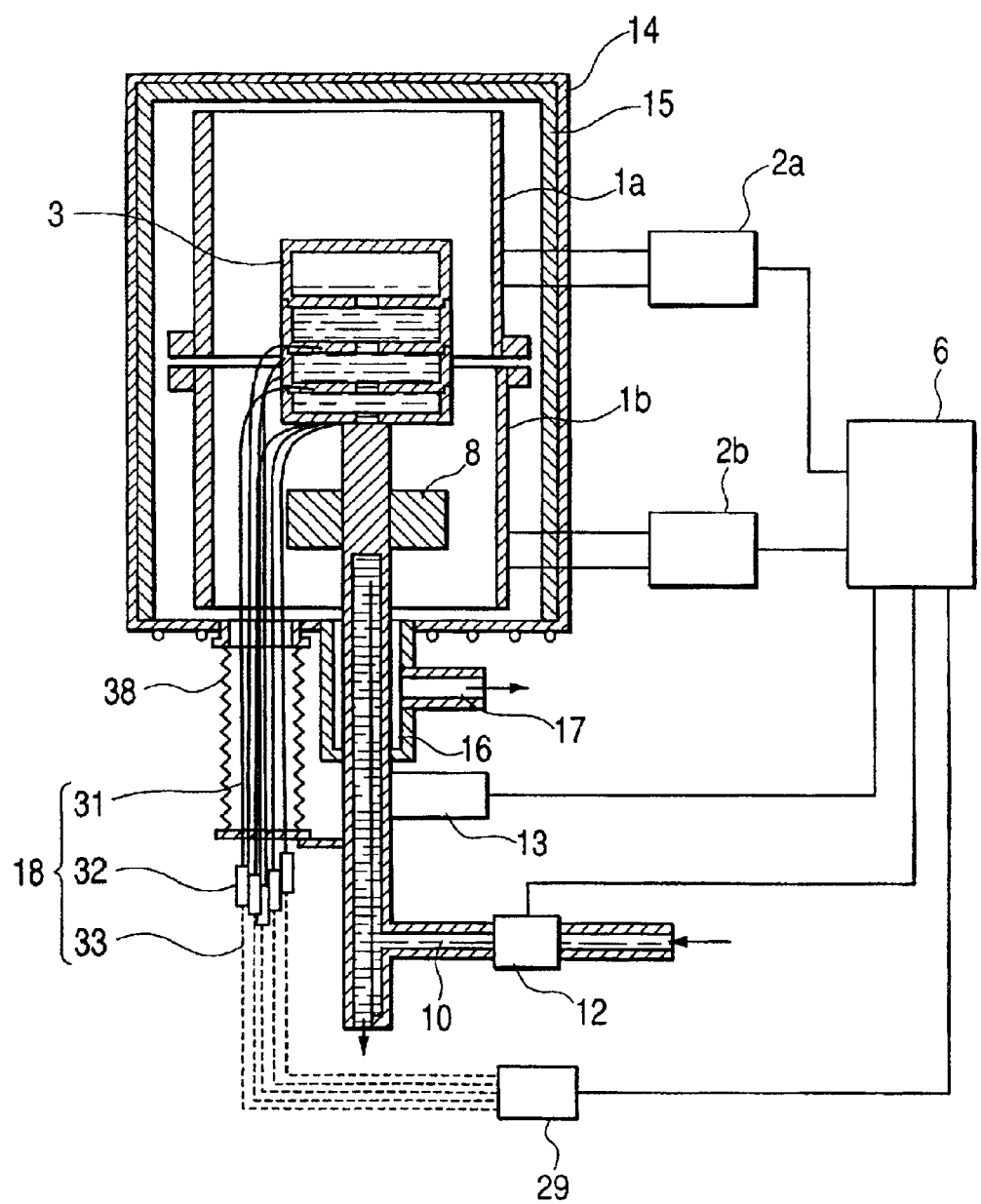
FIG. 29 is a diagrammatic cross-sectional illustration of a crystal growth apparatus according to a still further embodiment of the present invention.

As shown in FIGS. 28 and 29, the thermocouple 18 is fixed to the feedthrough 37 at its sheathed portion 31. Alternatively, as shown in FIG. 24A, the sheathed portion 31 of the thermocouple 18, the connecting part 32 and part of the lead wires 33 may be held in the vacuum region and only the remaining lead wires 33 may be extended outside from the vacuum region.

In all the above Embodiments, calcium fluoride, lithium fluoride or the like may be used as the growth material, and used in the production of a fluoride crystal.

In addition, the structure of the thermocouple characterized in that the connecting part of the thermocouple at which the sheathed portion and lead wires are connected is held at 500° C. or below or that the loosening of the thermocouple which is caused by the movement of the crucible can be absorbed by the lead wires can widely be used also in moving objects other than the crucible. For example, it may be used in processing apparatus making use of corrosive gases at a high temperature, as exemplified by thin-film forming apparatus and impurity implantation apparatus.

The feedthrough structure for the thermocouple according to the present invention is also commonly be applicable to vacuum apparatus and to apparatus in which a measuring instrument and a vacuum chamber are separated by a wall.

As described above, according to Embodiments 9 to 12, the crystal growth furnace can be so controlled that the temperature distribution in the plane perpendicular to the direction of crystal growth can be in an upward convex isothermal curve. As a result, the crystal growth furnace can be so controlled as to make the region of supercooling small, and hence the stray crystals can be prevented from occurring, making it possible to produce a large-area and good-quality crystal stably. Also, the thermocouple and temperature measuring system of the present invention enables detection of temperature at a high precision.

The process for producing a fluoride crystal according to the present invention will be described. First, any of the crystal growth apparatus as shown in FIGS. 16 to 19 is made ready for use. Then, a fluoride growth material is put in the crucible 3. The heaters 1a and 1b are electrified to melt the fluoride growth material, and are kept as they are until the temperature in the furnace no longer changes with time to become constant. Next, the crucible is moved downward while monitoring the temperature of the growth material by means of a temperature detector such as the thermocouple (in practice, while detecting the temperature of the crucible or heaters).

Here, the temperature detector may preferably be the thermocouple having a Ta sheath tube. A radiation thermometer or a Peltier device may also be used. Also, the temperature detector may be provided in plurality on the plane intersecting the direction of crystal growth.

After the temperature change ΔT ascribable to latent heat has been detected, the crystal growth rate and/or the position of solid-liquid interface is/are found to control the crystal growth furnace so that the rate of crystal growth does not vary or the position of solid-liquid interface does not vary. The most simple method is to once lower the crucible-descending rate. Other methods have described previously.

Subsequently the crucible-descending rate is controlled similarly so that the crystal growth rate or the position of solid-liquid interface does not vary. Thus, a fluoride crystal having a large diameter and a good uniformity can be obtained.

What is claimed is:

1. A process for crystal growth by using a crystal growth apparatus comprising a crucible for holding a crystal material and a heating means, comprising the steps of:
providing a plurality of temperature detectors at the bottom of the crucible;
detecting a temperature distribution across the bottom of the crucible by using the plurality of temperature detectors; and
controlling the heating means such that a temperature at a center portion of the bottom of the crucible is smaller than a temperature at a periphery portion of the bottom of the crucible.

2. The process according to claim 1,
wherein the interior of the crucible is divided into plural layers by a plurality of disks formed across respective cross-sections of the crucible, wherein the temperature detecting means is further provided in the disks, and wherein said process further comprises the step of detecting a temperature distribution across said respective disks.

3. The process according to claim 2, wherein each disk has an opening at almost its center.

4. A process for crystal growth by using a crystal growth apparatus comprising a crucible for holding a crystal material, the crucible being divided into plural layers by a plurality of disks formed across respective cross-sections of the crucible, the crystal growth apparatus further comprising a heating means, comprising the steps of:
providing a temperature detecting means in at least one of the disks;
detecting the temperature distribution across said at least one of said disks by using said temperature detecting means; and
controlling the heating means such that in the detected temperature distribution across said at least one disk, a temperature at a center portion of cross-sections of the crucible is smaller than a termperature at a periphery portion of the respective cross-sections.

5. The process according to claim 4, wherein each disk has an opening at almost its center.

6. The process according to claim 1 or claim 4, wherein the crystal growth apparatus comprises a cooling means, and a step of controlling the cooling means is effected by adjusting a flow rate of a cooling medium flowed into the cooling means.

7. The process according to claim 1 wherein a temperature at a center portion of the bottom of the crucible is minimized.

8. The process according to claim 4, wherein a temperature at a center portion of the cross-sections of the crucible is minimized.

9. The process according to claim 1, 2, 3, 4, or 5, in which the crystal growth apparatus also includes a cooling means, wherein said process further comprises a step of controlling the cooling means, and wherein said step of controlling the cooling means is effected by adjusting a flow rate of cooling medium flowed into the cooling means.

10. The process according to claim 2, 3, 4, or 5, wherein the temperature detecting means includes a plurality of thermocouples and said step of detecting the temperature distribution is effected by said thermocouples.

11. A crystal growth apparatus comprising a crucible for holding a crystal material, a heating means, a plurality of temperature detectors provided at the bottom of the crucible for detecting a temperature distribution, and a control means for controlling the heating means such that a temperature at a center portion of the bottom of the crucible is smaller than a temperature at a periphery portion of the bottom of the crucible.

12. A crystal growth apparatus comprising a crucible for holding a crystal material, the crucible being divided into plural layers by a plurality of disks formed across respective cross-sections of the crucible, the crystal growth apparatus further comprising a heating means; a temperature detecting means provided in at least one of the disks for detecting a temperature distribution across that disk; and a control means for controlling the heating means such that in the detected temperature distribution across at least one disk, a temperature at a center portion of cross-sections of the crucible is smaller than a temperature at a periphery portion of cross-sections of the crucible.

13. The crystal growth apparatus according to claim 11 or claim 12, wherein the crystal growth apparatus comprises a cooling means, and the control means adjusts a flow rate of cooling medium flowed into the cooling means.

14. The crystal growth apparatus according to claim 11, wherein a temperature at a center portion of the bottom of the crucible is minimized.

15. The crystal growth apparatus according to claim 12, wherein a temperature at a center portion of cross-sections of the crucible is minimized.

* * * * *

UNITED STATES PATENT AND TRADEMARK OFFICE
CERTIFICATE OF CORRECTION

PATENT NO. : 7,014,707 B2
APPLICATION NO. : 09/487718
DATED : March 21, 2006
INVENTOR(S) : Mitsuaki Amemiya It is certified that error appears in the above-identified patent and that said Letters Patent is hereby corrected as shown below:

COLUMN 6

Line 26, "deposit" should read --be deposited--.

COLUMN 9

Line 52, "is (second occurrence) should read --are--;.

COLUMN 10

Line 33, "is continued being descended" should read --continues to descend--;
Line 34, "occure" should read --occur--;
Line 35, "not" should read --not only--;
Line 65, "of" should be deleted; and
Line 67, "of" should be deleted.

COLUMN 12

Line 1, "is escaped" should read --escapes--.

COLUMN 14

Line 18, "is continued being descended" should read --continues to descend--.

COLUMN 18

Line 62, "vacuum" should read --in a vacuum--.

COLUMN 19

Line 30, "vacuum," should read --in a vacuum--; and
Line 33, "vacuum" should read --in a vacuum--.

UNITED STATES PATENT AND TRADEMARK OFFICE
CERTIFICATE OF CORRECTION

PATENT NO. : 7,014,707 B2
APPLICATION NO. : 09/487718
DATED : March 21, 2006
INVENTOR(S) : Mitsuaki Amemiya It is certified that error appears in the above-identified patent and that said Letters Patent is hereby corrected as shown below:

COLUMN 29

Line 60, "wire3 33" should read --wires 33--.

COLUMN 30

Line 6, "vacuum" should read --in a vacuum--.

COLUMN 31

Line 9, "upward" should read --upwardly--.

COLUMN 33

Line 2, "be" should be deleted.

Signed and Sealed this

Twenty-third Day of January, 2007

JON W. DUDAS
*Director of the United States Patent and Trademark Office*